United States Patent
Oowaki et al.

(10) Patent No.: US 6,611,450 B2
(45) Date of Patent: Aug. 26, 2003

(54) FERROELECTRIC RANDOM ACCESS MEMORY

(75) Inventors: Yukihito Oowaki, Yokohama (JP); Sumiko Doumae, Yokohama (JP)

(73) Assignee: Kabushiki Kaisha Toshiba, Minato-Ku (JP)

( * ) Notice: Subject to any disclaimer, the term of this patent is extended or adjusted under 35 U.S.C. 154(b) by 0 days.

(21) Appl. No.: 10/087,837

(22) Filed: Mar. 5, 2002

(65) Prior Publication Data

US 2002/0122328 A1 Sep. 5, 2002

(30) Foreign Application Priority Data

Mar. 5, 2001 (JP) ........................... 2001-060422

(51) Int. Cl.$^7$ ................................. G11C 7/00
(52) U.S. Cl. ..................... 365/145; 365/189.09
(58) Field of Search ..................... 365/145, 189.09, 365/195, 206, 203, 205

(56) References Cited

U.S. PATENT DOCUMENTS

| 5,525,528 A | | 6/1996 | Perino et al. |
| 5,903,492 A | | 5/1999 | Takashima |
| 5,953,245 A | * | 9/1999 | Nishimura ............... 365/145 |
| 6,522,567 B2 | * | 2/2003 | Iwanari .................. 365/145 |

FOREIGN PATENT DOCUMENTS

JP 2000-003948 1/2000

* cited by examiner

*Primary Examiner*—Vu A. Le
(74) *Attorney, Agent, or Firm*—Banner & Witcoff, Ltd.

(57) ABSTRACT

A ferroelectric random access memory is disclosed, which comprises a cell array including a plurality of memory cells each having a ferroelectric memory device and a cell selecting transistor connected in series to the ferroelectric storage device, and imprint restricting circuit configured to restrict generation of an imprint by setting a polarization amount of a ferroelectric film of the ferroelectric memory device in the memory cell to an amount smaller than a polarization amount generated at a normal write time.

43 Claims, 17 Drawing Sheets

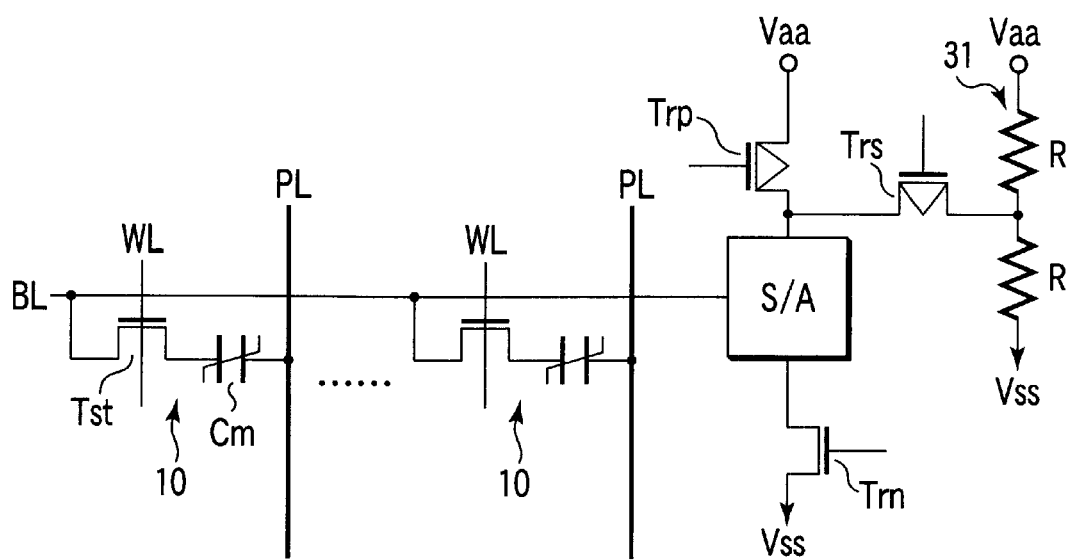
F I G. 3
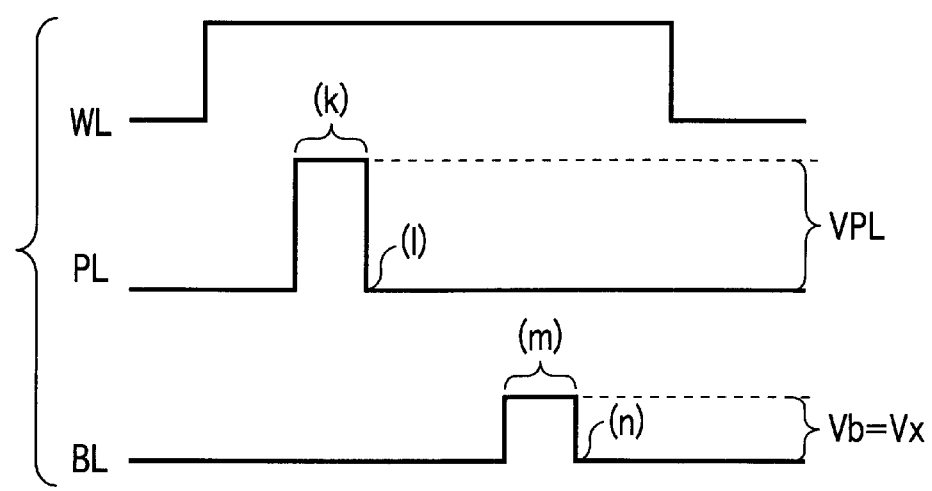
F I G. 4

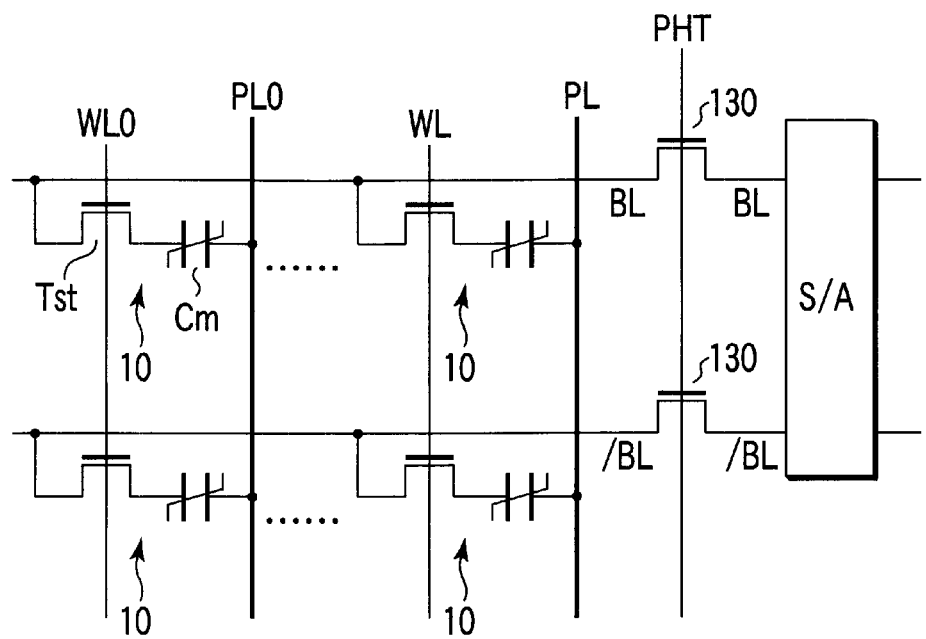
F I G. 29
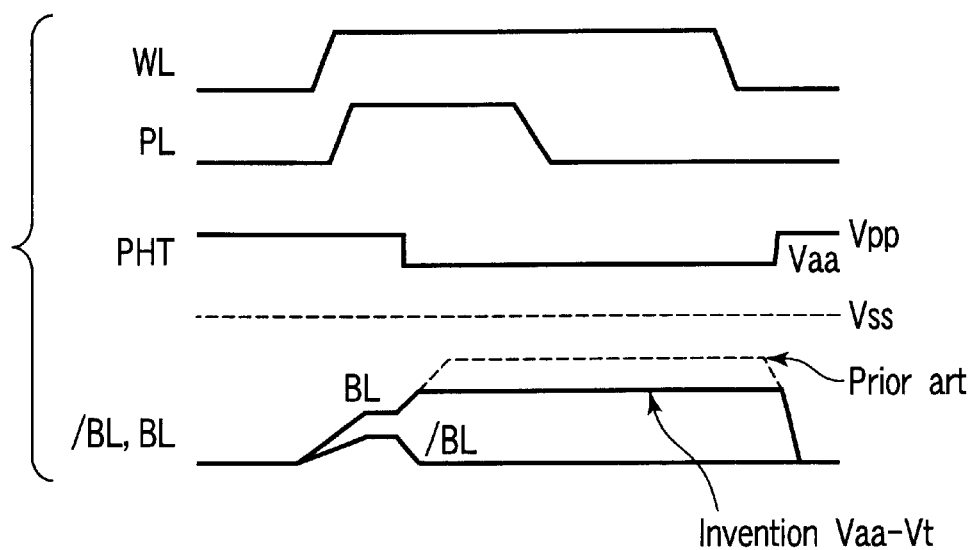
F I G. 30

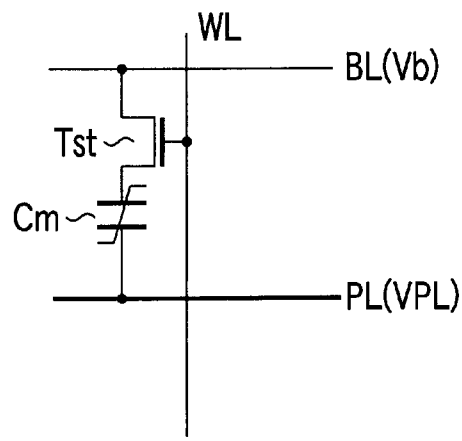
F I G. 31
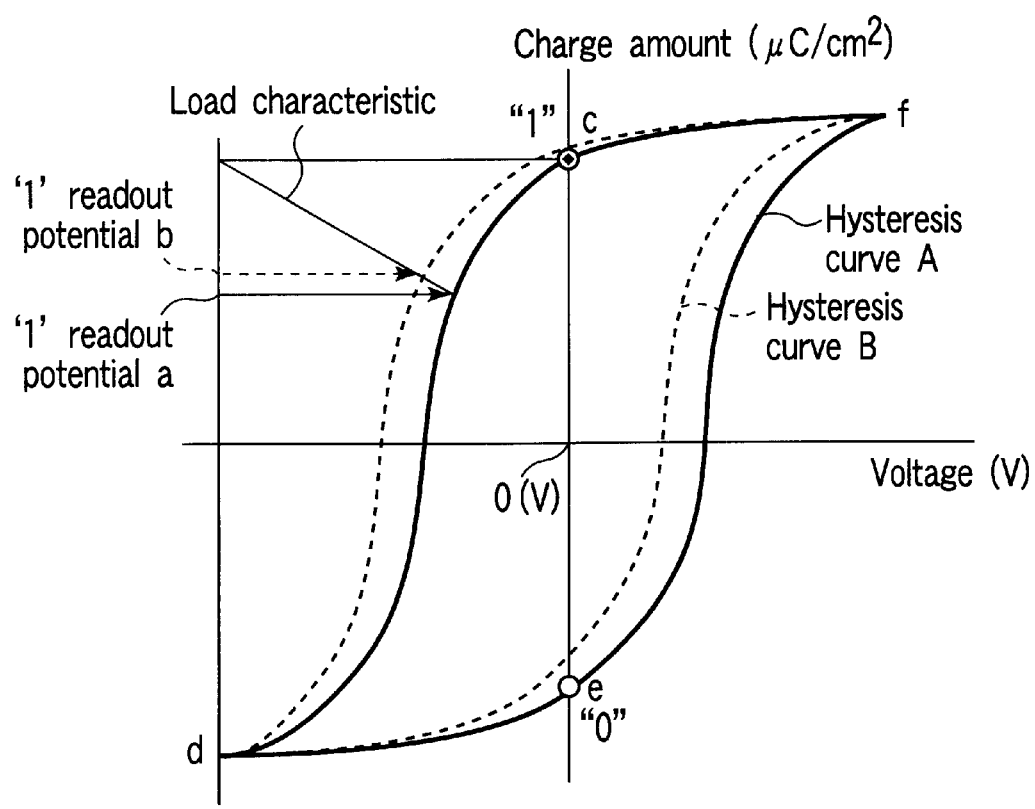
F I G. 32

FERROELECTRIC RANDOM ACCESS MEMORY

CROSS-REFERENCE TO RELATED APPLICATIONS

This application is based upon and claims the benefit of priority from the prior Japanese Patent Application No. 2001-060422, filed Mar. 5, 2001, the entire contents of which are incorporated herein by reference.

BACKGROUND OF THE INVENTION

1. Field of the Invention

The present invention relates to a ferroelectric random access memory (FeRAM) and more particularly to suppression of the imprint in a FeRAM memory cell.

2. Description of the Related Art

In recent years, the FeRAM has been developed aggressively as a semiconductor storage device for low power consumption and mentioned in, for example, U.S. Pat. No. 4,873,664 (Eaton, Jr), "A Ferroelectric DRAM Cell for High Density NVRAMs", S. S. Eaton, Jr et al., ISSCC Digest of Technical Papers, pp. 130–131, February 1988.

When electric field is applied to a ferroelectric insulation film used in the FeRAM, polarization of charges is generated, so that the relation between applied voltage and polarization amount indicates so-called hysteresis characteristic.

Conventionally, FeRAM cells of various kinds of configuration have been proposed and recently, 1-transistor/1-capacitor (1T/1C) type FeRAM, in which a cell selecting MOS transistor T is connected to a ferroelectric capacitor C employing ferroelectric film between electrodes, and 2T/2C type FeRAM, in which two cells of 1T/1C FeRAM are used as a pair and so on are available.

FIG. 31 shows an equivalent circuit having 1-transistor/1-capacitor (1T/1C) as an example of the FeRAM cell.

In a memory cell array in which a plurality of the FeRAM cells are arrayed, a drain of a cell selecting MOS transistor Tst of each cell is connected to a bit line BL, a gate of a cell selecting MOS transistor Tst is connected to a word line WL and an end (plate electrode) of a ferroelectric capacitor Cm is connected to a plate line PL.

FIG. 32 is a characteristic diagram showing the relation between applied electric field (applied voltage V) on the ferroelectric film for use in the FeRAM cell and polarization amount P.

The FeRAM cell stores binary data, which is determined depending upon which remnant polarization Pr of the ferroelectric film is positive or negative when no electric field is applied to the ferroelectric film of the ferroelectric capacitor in the FeRAM cell or when applied voltage between capacitor electrodes is V=0, as evident from this hysteresis characteristic.

Here, "positive" or "negative" of the remnant polarization Pr indicates in which way the polarization is directed between the plate electrode of the ferroelectric capacitor and bit line electrode. A state in which the polarization is present in one direction is defined as data "1" while a state in which the polarization is present in the other direction is defined as data "0".

In order to improve reliability of the above-described FeRAM, increasing rewritable times of the FeRAM cell, holding data for a long hour, improvement of environment resistance, suppression of imprint and the like can be mentioned. One of the measures, which cannot be improved easily is suppression of imprint.

The imprint refers to such phenomenon that if the FeRAM cell is left for a long hour in a state in which data is written therein (with the ferroelectric film polarized) or the ferroelectric film is exposed to high temperatures in a state in which data is written in the FeRAM cell, movable charges are gathered around polarization domain in a direction for stabilizing the polarization, so that internal electric field is generated in the ferroelectric film. Meanwhile, no imprint is generated during ordinary operation of the FeRAM cell.

Because the aforementioned internal electric field, which is generated in the ferroelectric film, is temporary, the imprint is not a phenomenon which causes such a hard error as destruction or aging of devices. However, this cause such a soft error which disables polarization data in an opposite direction to a polarization direction of storage data in the FeRAM cell from being written properly.

A problem about the imprint in the FeRAM will be described in detail.

In manufacturing process of the FeRAM, after a screening test for screening which a chip region is good or bad is carried out on the stage of wafer, the wafer is cut to chips and the respective chips are assembled in the form of a package. Or after a shipment test is carried out with data written into the FeRAM, the FeRAM is soldered to a circuit substrate of an application product. In these cases, a high temperature of 200 to 300° C. is applied to the FeRAM cell in the polarization state. In such a case, the imprint is generated.

FIG. 32 shows hysteresis characteristic with a solid line in case where the direction of remnant polarization Pr in the ferroelectric capacitor is for example in the direction which defines storage of data "1" while indicating hysteresis characteristic with a dotted line in case where the imprint is generated after that. The hysteresis characteristic in case where the imprint is generated is deflected from its center as if bias voltage is applied.

According to the hysteresis characteristic in case where the imprint is generated, the polarization state is accelerated so that it becomes unlikely to be inverted to inverse polarization and the quantity of signals for reading the inverse polarization is reduced, thereby leading to reduction of the characteristic of the FeRAM cell.

When reading data "1" in FIG. 32, read potential at a point where a straight line indicating the relation between the capacity C, applied voltage V and charge amount Q of the ferroelectric capacitor intersects the hysteresis characteristic is a when the hysteresis characteristic is expressed in the solid line A and b when the hysteresis characteristic is expressed with the dotted line B. And the read signal amount drops.

As described above, the conventional FeRAM has a problem that the soft error is generated by acceleration of the imprint which occurs because the ferroelectric film is left for a long hour or exposed to high temperatures.

BRIEF SUMMARY OF THE INVENTION

According to an aspect of the present invention, there is provided a ferroelectric random access memory comprising: a cell array including a plurality of memory cells each having a ferroelectric memory device and a cell selecting transistor connected in series to the ferroelectric storage device; and imprint restricting circuit configured to restrict generation of an imprint by setting a polarization amount of a ferroelectric film of the ferroelectric memory device in the memory cell to an amount smaller than a polarization amount generated at a normal write time.

According to another aspect of the present invention, there is provided a ferroelectric random access memory comprising a cell array including a plurality of memory cells each having a ferroelectric memory device and a switching transistor connected in parallel to the ferroelectric storage device; and imprint restricting circuit configured to restrict generation of an imprint by setting a polarization amount of a ferroelectric film of the ferroelectric memory device in the memory cell to an amount smaller than a polarization amount generated at a normal write time.

According to a further aspect of the present invention, there is provided a ferroelectric random access memory comprising: a sense amplifier configured to be connected to a bit line and to amplify data read out to the bit line; a cell block comprising a plurality of memory cells; and a separating transistor inserted in the bit line between the sense amplifier and the cell block, wherein the separating transistor is controlled by a gate control signal at a write time to lower a bit line potential on the cell block side than a bit line potential on the sense amplifier side.

BRIEF DESCRIPTION OF THE SEVERAL VIEWS OF THE DRAWING

FIG. 3 is a circuit diagram showing part of the FeRAM according to a first embodiment of the first concept of the present invention, in particular, a circuit diagram showing in detail part of a cell array 11 in FIG. 1 and a write/readout circuit including a related low voltage write circuit 12;

FIG. 4 is a timing signal diagram showing an example of a low voltage write operation of the low voltage write circuit of FIG. 3;

FIG. 29 is a circuit diagram showing part of a FeRAM according to a second embodiment of the second concept of the present invention;

FIG. 30 is a timing signal diagram showing an example of the low voltage write operation of the FeRAM of FIG. 29;

FIG. 31 is an equivalent circuit diagram of an FeRAM cell formed of 1-transistor/1-capacitor (1T/1C); and FIG. 32 is a characteristic diagram showing the relation (hysteresis curve) between an electric field (voltage V) of the ferroelectric film for use in the FeRAM cell and a polarization amount P.

DETAILED DESCRIPTION OF THE INVENTION

Hereinafter, the preferred embodiment of the present invention will be described in detail with reference to the accompanying drawings.

<First Concept of the Invention>

Figure 1:
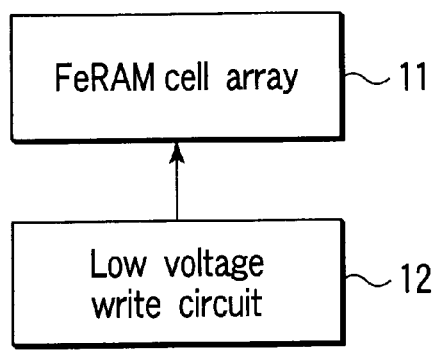
FIG. 1 is a block diagram schematically showing part of a FeRAM according to a first concept of the present invention.
Figure 2:
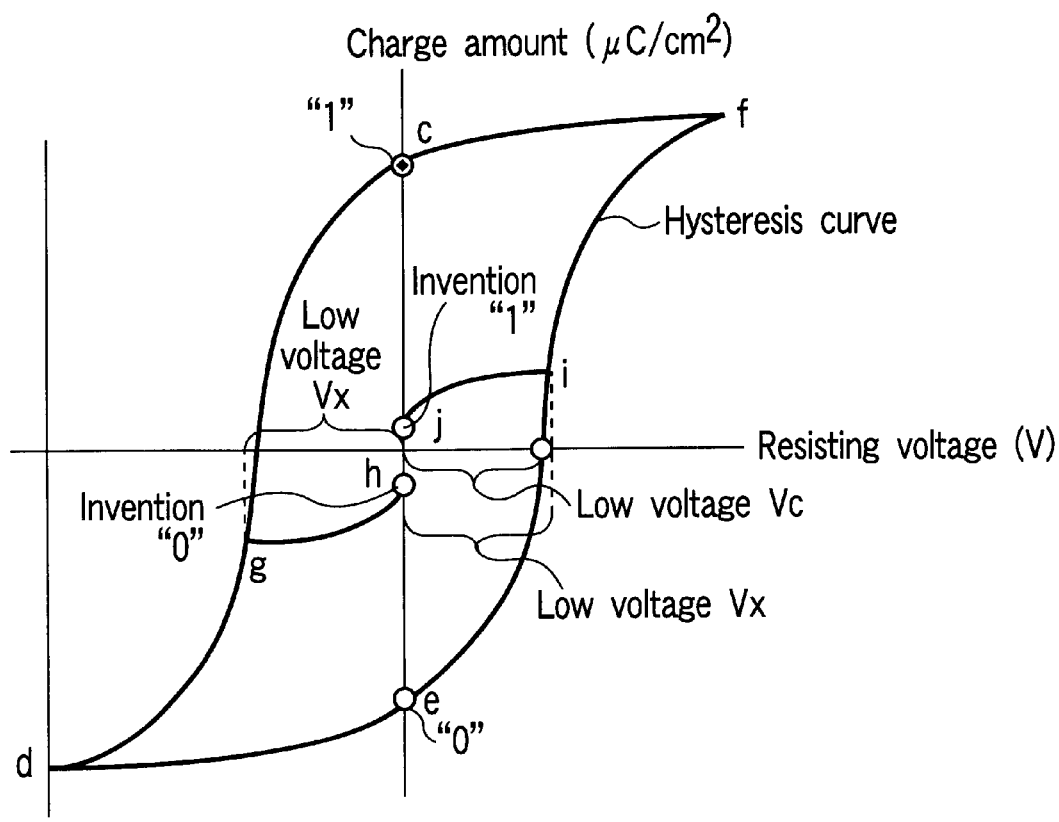
FIG. 2 is a hysteresis characteristic curve showing an example of the polarization state of a FeRAM cell for use in the FeRAM of FIG. 1.

FIG. 1 is a block diagram schematically showing part of a FeRAM according to a first concept of the present invention. FIG. 2 is a hysteresis characteristic curve showing an example of the polarization state of a FeRAM cell for use in the FeRAM of FIG. 1.

The structure and operation of the FeRAM will be described with reference to FIGS. 1 and 2. This FeRAM comprises a cell array 11 in which a plurality of the FeRAM cells each having a ferroelectric memory device and a cell selecting transistor connected to the ferroelectric storage device are arrayed in a matrix form and imprint restricting circuit 12 in which the polarization amount of the ferroelectric film of the ferroelectric storage device in each FeRAM cell is set to an amount smaller than the amount of polarization generated at the normal write time so as to suppress generation of the imprint.

As an example of the imprint restricting circuit 12, there is used a low voltage write circuit which applies a voltage Vx lower than a voltage applied at the normal write time to the ferroelectric capacitor of each FeRAM cell for writing so as to make the polarization amount of the ferroelectric film lower than the amount of polarization generated at the normal write time.

It is preferable that the aforementioned low voltage Vx is higher than a coercive voltage of the ferroelectric capacitor shown in FIG. 2 and lower than a saturation voltage which saturates the polarization amount of the ferroelectric capacitor. After the normal write operation is executed, the polarization point is "c" in case of data "1" or "e" in case of data "0". However, after the low voltage write operation is executed at the low voltage Vx, the polarization point is "j" in case of data "1" or "h" in case of data "0".

The aforementioned low voltage write circuit 12 is driven at a desired timing and it is preferable it is driven just before a heating process is applied to the FeRAM.

That is, at the wafer stage in manufacturing the FeRAM, a screening test for screening whether each chip region is good or bad is carried out with the FeRAM cell polarized due to write of data into the FeRAM cell. After that, the wafer is diced to chips and the respective chips are assembled into a form of package. At this time, heat is applied to each chip. Therefore, it is preferable to execute the write at the low voltage Vx before proceeding to a next step after the screening test at the wafer stage is ended.

Generally, after the assembly to the package, the screening test for screening whether each package is good or bad is executed with the FeRAM cell polarized due to rewrite of data into the FeRAM cell and then, a good package is shipped as a product. When the package is soldered to a circuit substrate of an application product at a shipment destination, high temperature of about 200 to 300° C. is applied to the FeRAM cell. Further, the packaged FeRAM may be stored under high temperatures for a long time until it is shipped to a customer. Thus, it is preferable to execute write at the low voltage Vx before shipment after the screening test at the package stage is ended.

<First Embodiment of the First concept of the Invention>

FIG. 3 is a circuit diagram showing part of the FeRAM according to a first embodiment of the first concept of the present invention, in particular, a circuit diagram showing in detail part of a cell array 11 in FIG. 1 and a write/readout circuit including a related low voltage write circuit 12.

FIG. 4 is a timing signal diagram showing an example of the low voltage write operation to the FeRAM cell by using the low voltage write circuit of the FeRAM of FIG. 3.

In FIG. 3, reference numeral 10 denotes a FeRAM cell, symbol BL denotes a bit line, symbol WL denotes a word line and symbol PL denotes a plate line. Symbol S/A denotes a sense amplifier connected to the bit line BL, symbol Trp denotes a PMOS transistor for selectively connecting a normal write voltage Vaa to the sense amplifier S/A, and symbol Trn denotes a NMOS transistor for connecting ground potential Vss to the sense amplifier S/A.

Reference numeral 31 denotes a voltage divider circuit for generating for example, a Vaa/2 voltage by dividing the normal write voltage Vaa with two voltage dividing resistors R, R, and symbol Trs denotes a PMOS transistor for selectively connecting the Vaa/2 voltage to the sense amplifier S/A. The voltage divider circuit 31 and the PMOS transistor Trs form a low voltage write circuit in which the Vaa/2 voltage is applied selectively to the bit line BL through the sense amplifier S/A.

In order to apply the Vaa voltage to the bit line BL through the sense amplifier S/A at the normal write time, the PMOS transistor Trs is turned off and the PMOS transistor Trp is turned on.

In order to apply a Vaa/2 pulse voltage to the bit line BL through the sense amplifier S/A at the low voltage write time, the PMOS transistor Trp is turned off and the PMOS transistor Trs is turned on.

Each FeRAM cell 10 denotes a unit cell formed of a cell selecting MOS transistor Tst and a ferroelectric capacitor Cm connected in series to the cell selecting MOS transistor Tst. A drain of the cell selecting MOS transistor Tst is connected to the bit line BL, a gate of the cell selecting MOS transistor Tst is connected to the word line WL and one terminal (plate electrode) of the ferroelectric capacitor Cm is connected to the plate line PL.

The timing signal diagram of FIG. 4 shows an example of the low voltage write operation to the FeRAM cell by using the low voltage write circuit of the FeRAM of FIG. 3.

In this low voltage write operation, a pulse voltage Vb to be applied to the bit line BL is a low voltage Vx having an amplitude about ½ a voltage VPL to be applied to the plate line PL.

The operation will be described. As shown in FIG. 4, with the bit line BL pre-charged to 0V, the word line WL is selected and next, the pulse voltage VPL is applied to the plate line PL. Consequently, irrespective of initial data, the polarization point of the FeRAM cell 10 is a polarization point "d" in FIG. 2 in a pulse voltage VPL application period (k) and when application of the pulse voltage VPL is ended at (l) in FIG. 4, it becomes a polarization point "e" in FIG. 2, so that data "0" having a normal polarization amount is presented.

After that, the pulse voltage Vb (=Vx) is applied to the bit line BL. As a result, the polarization point of the FeRAM cell 10 becomes a polarization point "i" in FIG. 2 in the pulse voltage Vb application period (m) and when application of the pulse voltage Vb is ended at (n) in FIG. 4, it becomes a polarization point "j" in FIG. 2, so that data "1" having a small polarization amount is presented.

At this time, if the word lines WL of all the cells 10 connected to the bit line BL applied with the pulse voltage Vb are selected, all those cells are accessed, thereby polarization efficiency being improved.

<Second Embodiment of the First Concept of the Invention>

Figure 5:
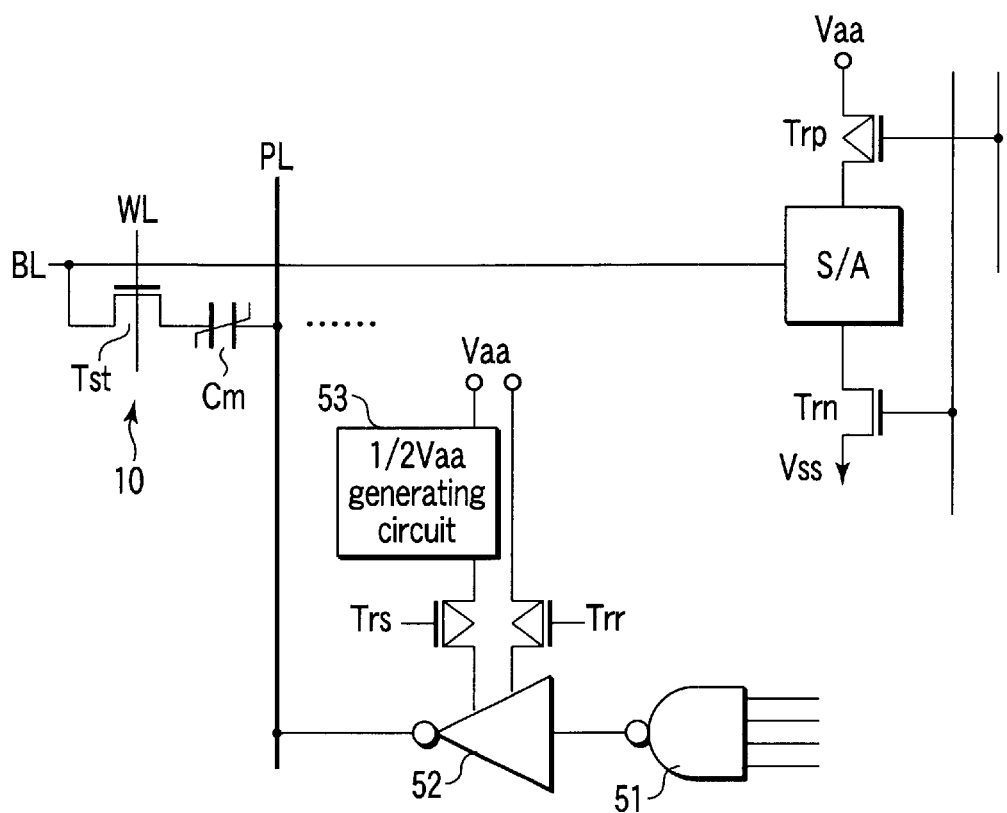
FIG. 5 is a circuit diagram showing part of the FeRAM according to a second embodiment of the first concept of the present invention, in particular, a circuit diagram showing in detail part of a cell array 11 in FIG. 1 and a write/readout circuit including a related low voltage write circuit 12.

FIG. 5 is a circuit diagram showing part of the FeRAM according to a second embodiment of the first concept of the present invention, in particular, a circuit diagram showing in detail part of a cell array 11 in FIG. 1 and a write/readout circuit including a related low voltage write circuit 12.

Figure 6:
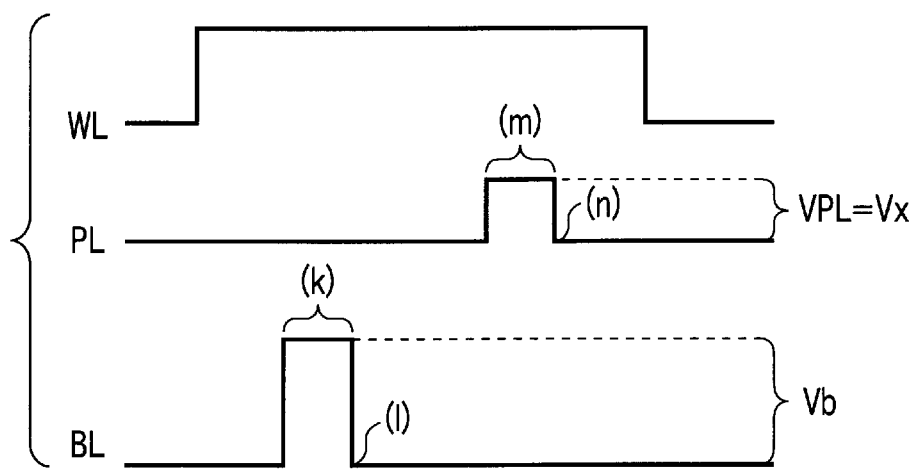
FIG. 6 is a timing signal diagram showing an example of the operation of the low voltage write circuit of FIG. 5.

FIG. 6 is a timing signal diagram showing an example of the low voltage write operation to the FeRAM cell by using the low voltage write circuit of the FeRAM of FIG. 5.

In FIG. 5, reference numeral 10 denotes a FeRAM cell, symbol BL denotes a bit line, symbol WL denotes a word line and symbol PL denotes a plate line. Symbol S/A denotes a sense amplifier connected to the bit line BL, symbol Trp denotes a PMOS transistor for selectively connecting a normal write voltage Vaa to the sense amplifier S/A, and symbol Trn denotes a NMOS transistor for connecting ground potential Vss to the sense amplifier S/A.

Reference numeral 51 denotes a plate line decoder circuit for selecting a plate line, reference numeral 52 denotes a plate line driving circuit, which is driven by output of the plate line decoder circuit 51 so as to supply a plate voltage VPL to the plate line PL, and symbol Trr denotes a PMOS transistor for connecting a normal write voltage Vaa selectively to the plate line driving circuit 52. Reference numeral 53 denotes a Vaa/2 generating circuit for generating a Vaa/2 voltage by receiving the normal write voltage Vaa. Symbol Trs denotes a PMOS transistor for connecting the aforementioned Vaa/2 voltage selectively to the plate line driving circuit 52. The Vaa/2 generating circuit 53 and the PMOS transistor Trs form a low voltage write circuit which applies the Vaa/2 voltage selectively to the plate line PL.

In order to apply the Vaa voltage to the plate line PL at the normal write time, the PMOS transistor Trs is turned off while the PMOS transistor Trr is turned on.

In order to apply the pulse voltage of Vaa/2 to the plate line PL at the low voltage write time, the PMOS transistor Trr is turned off while the PMOS transistor Trs is turned on.

Each FeRAM cell 10 denotes a unit cell formed of a cell selecting MOS transistor Tst and a ferroelectric capacitor Cm connected in series to the cell selecting MOS transistor Tst. A drain of the cell selecting MOS transistor Tst is connected to the bit line BL, a gate of the cell selecting MOS transistor Tst is connected to the word line WL and one terminal (plate electrode) of the ferroelectric capacitor Cm is connected to the plate line PL.

The timing signal diagram of FIG. 6 shows an example of the low voltage write operation to the FeRAM cell by using the low voltage write circuit of the FeRAM of FIG. 5.

In this low voltage write operation, it is preferable that a pulse voltage VPL to be applied to the plate line PL is a low voltage Vx having an amplitude about ½ a voltage Vb to be applied to the bit line BL.

The operation will be described. As shown in FIG. 6, with the plate line PL pre-charged to 0V, the word line WL is selected and next, the pulse voltage Vb is applied to the bit line BL. Consequently, irrespective of initial data, the polarization point of the FeRAM cell 10 is a polarization point "f" in FIG. 2 in a pulse voltage Vb application period (k) and when application of the pulse voltage Vb is ended at (l) in FIG. 6, it becomes a polarization point "c" in FIG. 2, so that data "1" having a normal polarization amount is presented.

After that, the pulse voltage VPL (=Vx) is applied to the plate line PL. As a result, the polarization point of the FeRAM cell 10 becomes a polarization point "g" in FIG. 2 in the pulse voltage VPL application period (m) and when application of the pulse voltage VPL is ended at (n) in FIG. 6, it becomes a polarization point "h" in FIG. 2, so that data "0" having a small polarization amount is presented.

<Third Embodiment of the First Concept of the Invention>

Figure 7:
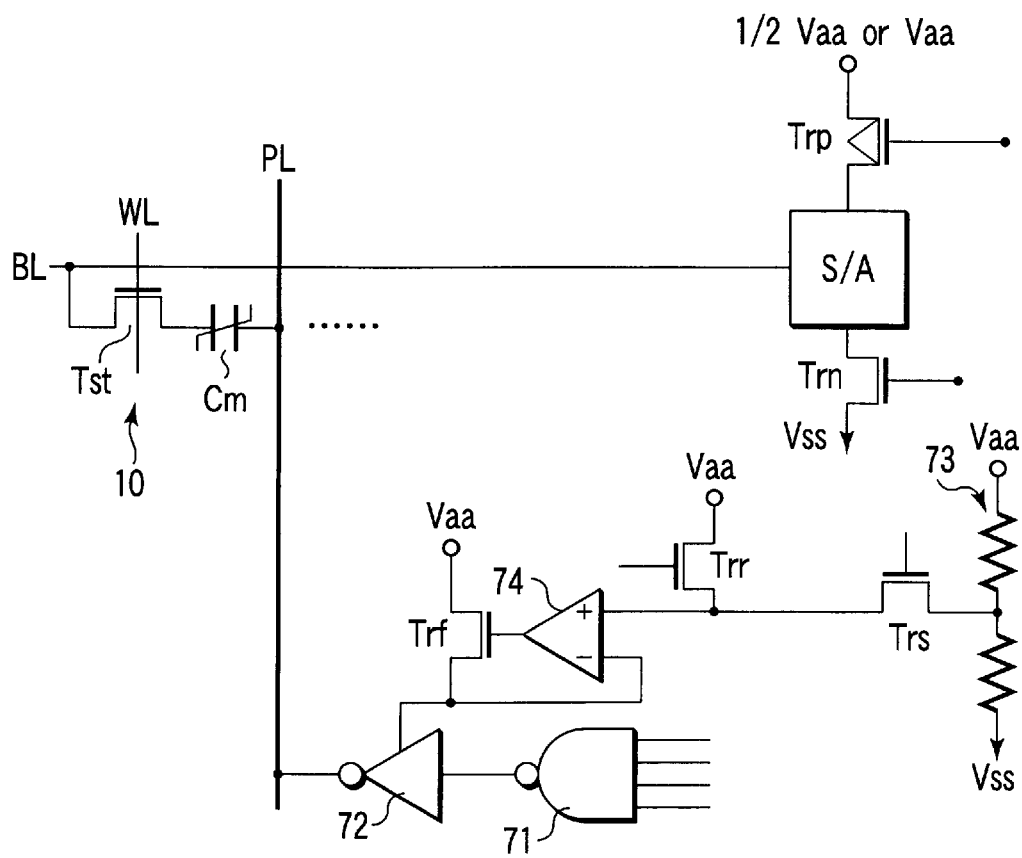
FIG. 7 is a circuit diagram showing part of the FeRAM according to a third embodiment of the first concept of the present invention, in particular, a circuit diagram showing in detail part of a cell array 11 in FIG. 1 and a write/readout circuit including a related low voltage write circuit 12.

FIG. 7 is a circuit diagram showing part of the FeRAM according to a third embodiment of the first concept of the present invention, in particular, a circuit diagram showing in detail part of a cell array 11 in FIG. 1 and a write/readout circuit including a related low voltage write circuit 12. The circuit shown in FIG. 7 comprises a circuit for applying the Vaa/2 voltage selectively to the bit line BL and a circuit for applying the Vaa/2 voltage selectively to the plate line PL.

Figure 8:
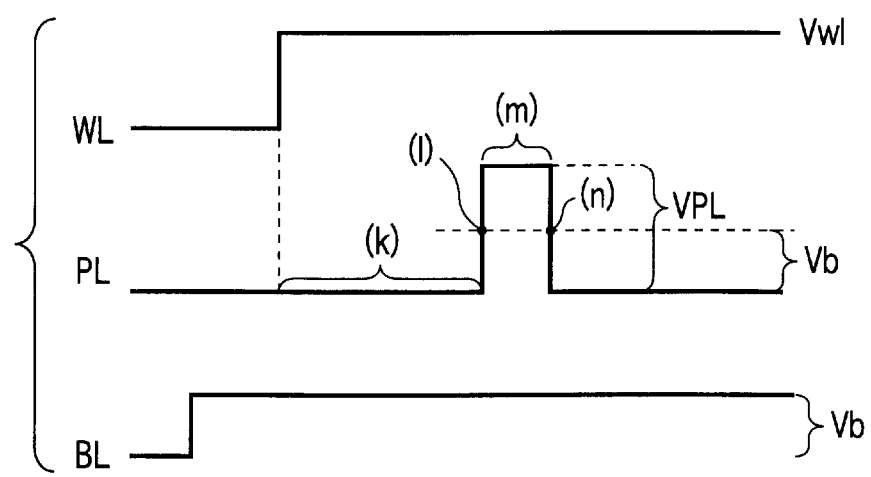
FIG. 8 is a timing signal diagram showing an example of the operation of the low voltage write circuit of FIG. 7.

FIG. 8 is a timing signal diagram showing an example of the low voltage write operation to the FeRAM cell by using the low voltage write circuit of the FeRAM of FIG. 7.

In FIG. 7, reference numeral 10 denotes a FeRAM cell, symbol BL denotes a bit line, symbol WL denotes a word line and symbol PL denotes a plate line. Symbol S/A denotes a sense amplifier connected to the bit line BL, symbol Trp denotes a PMOS transistor for selectively connecting a normal write voltage Vaa or a low voltage write voltage Vaa/2 to the sense amplifier S/A, and symbol Trn denotes a NMOS transistor for connecting ground potential Vss to the sense amplifier S/A. The PMOS transistor Trp and the NMOS transistor Trn form a circuit for applying the normal write voltage Vaa and the low voltage write voltage Vaa/2 to the bit line BL through the sense amplifier S/A.

Reference numeral 71 denotes a plate line decoder circuit for selecting a plate line and reference 72 denotes a plate line driving circuit which is driven by output of the plate line decoder circuit 71 so as to supply the plate voltage VPL to the plate line PL.

Reference numeral 73 denotes a voltage divider circuit (Vaa/2 generating circuit) for generating the low voltage write voltage Vaa/2 by dividing the normal write voltage Vaa with two voltage dividing resistors R, R, reference numeral 74 denotes a voltage comparing circuit, a symbol Trr denotes a MOS transistor for connecting the normal write voltage Vaa to one input node (+) of the voltage comparing circuit 74 selectively and symbol Trs denotes a MOS transistor for connecting the low voltage write voltage Vaa/2 to one input node (+) of the voltage comparing circuit 74 selectively.

Symbol Trf denotes a MOS transistor for feedback control, in which the normal write voltage Vaa is applied to its source, its gate is connected to an output node of the voltage comparing circuit 74, and its drain is connected to the other input node (−) of the voltage comparing circuit 74 and connected to an operating power node of the plate line driving circuit 72.

The Vaa/2 generating circuit 73, the MOS transistors Trs and Trs, the voltage comparing circuit 74, the MOS transistor Trf, and the plate line driving circuit 72 form a circuit which applies the normal write voltage Vaa or the low voltage write voltage Vaa/2 selectively to the plate line PL.

In order to apply the Vaa voltage to the plate line PL at the normal write time, the PMOS transistor Trs is turned off while the PMOS transistor Trr is turned on.

In order to apply the pulse voltage of Vaa/2 to the plate line PL at the low voltage write time, the PMOS transistor Trr is turned off while the PMOS transistor Trs is turned on.

Each FeRAM cell 10 denotes a unit cell formed of a cell selecting MOS transistor Tst and a ferroelectric capacitor Cm connected in series to the cell selecting MOS transistor Tst. A drain of the cell selecting MOS transistor Tst is connected to the bit line BL, a gate of the cell selecting MOS transistor Tst is connected to the word line WL and one terminal (plate electrode) of the ferroelectric capacitor Cm is connected to the plate line PL.

The timing signal diagram of FIG. 8 shows an example of the low voltage write operation to the FeRAM cell by using the low voltage write circuit of the FeRAM of FIG. 7.

In this low voltage write operation, the bit line pre-charge voltage Vb is a voltage having an amplitude about ½ the pulse voltage VPL applied to the plate line PL.

The operation will be described. With the bit line BL pre-charged to the bit line pre-charge voltage Vb (about ½ VPL) as shown in FIG. 8, a word line voltage Vwl is raised so as to select the word line WL. Consequently, the polarization point of the FeRAM cell 10 becomes the polarization point "i" in FIG. 2 in the period (k) after the word line WL is selected. After that, the pulse voltage VPL is applied to the plate line PL one or more. When the pulse voltage VPL becomes equal to the bit line voltage Vb at (l) in FIG. 8, the polarization point of the FeRAM cell 10 becomes the polarization point "j" in FIG. 2. The polarization point of the FeRAM cell 10 becomes the polarization point "g" in FIG. 2 in the pulse voltage VPL application period (m) and when the pulse voltage VPL becomes equal to the bit voltage Vb at (n) in FIG. 8, the polarization point becomes the polarization point "h" in FIG. 2.

As described above, with a fixed voltage of about ½ VPL applied to the bit line BL, when the pulse voltage VPL is applied to the plate line PL one or more, then data write into the FeRAM cell 10 is carried out at a voltage about ½ at the normal write time. Therefore, the polarization amount in the ferroelectric capacitor is smaller than the polarization amount at the normal write time.

Figure 9:
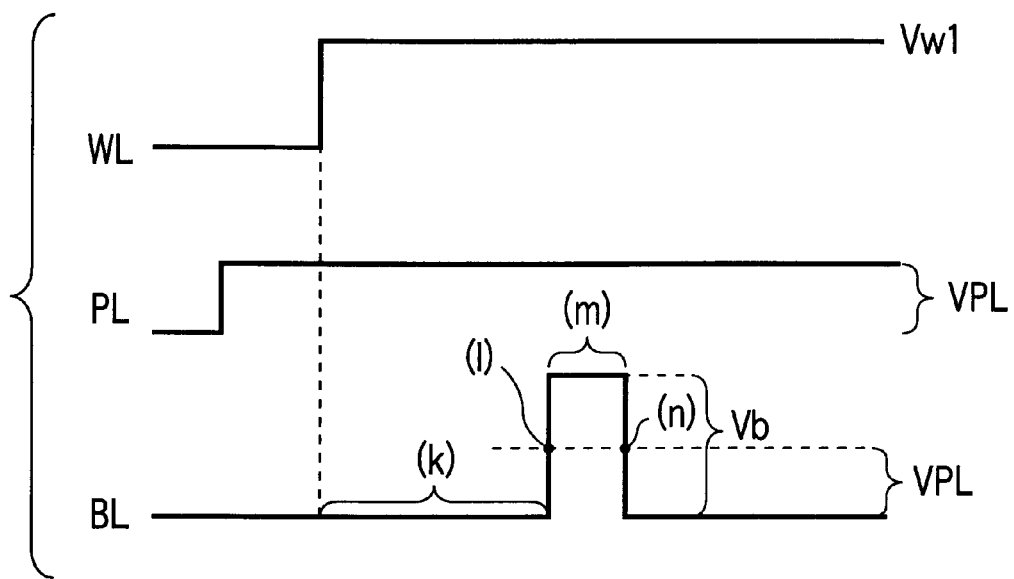
FIG. 9 is a timing signal diagram showing other example of the operation of the low voltage write circuit of FIG. 7.

FIG. 9 shows a timing signal diagram of another example of the low voltage write operation to the FeRAM cell by using the low voltage write circuit of the FeRAM of FIG. 7.

In this low voltage write operation, the pulse voltage VPL applied to the plate line PL is a voltage having an amplitude about ½ the pulse voltage Vb applied to the bit line BL.

The operation will be described. With the plate line PL pre-charged to the plate line pre-charge voltage VPL (about ½ Vb) as shown in FIG. 9, a word line voltage Vwl is raised so as to select the word line WL. Consequently, the polarization point of the FeRAM cell 10 becomes the polarization point "g" in FIG. 2 in the period (k) after the word line WL is selected. After that, the pulse voltage Vb is applied to the bit line BL one or more. When the pulse voltage Vb becomes equal to the pulse voltage VPL at (l) in FIG. 9, the polarization point of the FeRAM cell 10 becomes the polarization point "h" in FIG. 2. The polarization point of the FeRAM cell 10 becomes the polarization point "i" in FIG. 2 in the pulse voltage Vb application period (m) and when the pulse voltage Vb becomes equal to the pulse voltage VPL at (n) in FIG. 9, the polarization point becomes the polarization point "j" in FIG. 2.

As described above, with a fixed voltage of about ½ Vb applied to the plate line PL, when the pulse voltage Vb is applied to the bit line BL one or more, then data write into the FeRAM cell 10 is carried out at a voltage about ½ at the normal write time. Therefore, the polarization amount in the ferroelectric capacitor is smaller than the polarization amount at the normal write time.

<Fourth Embodiment of the First Concept of the Invention>

Figure 10:
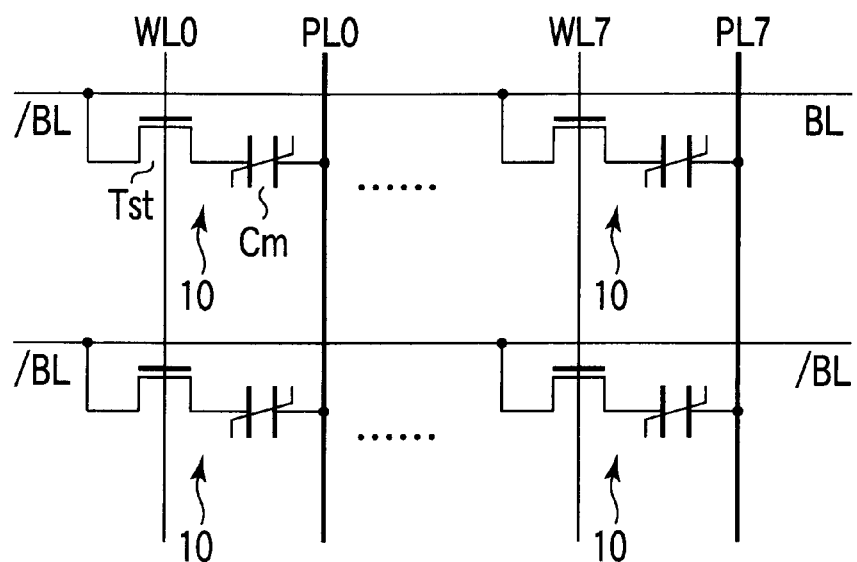
FIG. 10 is a circuit diagram showing a cell block formed by connecting a plurality of unit cells in series.

FIG. 10 is a circuit diagram showing a cell block formed of a plurality (eight in this embodiment) of unit cells 10. FIG. 10 indicates only four unit cells 10 as a representative.

A drain of the cell selecting MOS transistor Tst of each FeRAM cell 10 is connected to the bit line BL or /BL, a gate of the cell selecting MOS transistor Tst of each FeRAM cell 10 is connected to a corresponding one word lines WL0 to WL7, and one terminal (plate electrode) of the ferroelectric capacitor Cm of each FeRAM cell 10 is connected to a corresponding one of plate lines PL0, PL1, . . . PL7.

Figure 11:
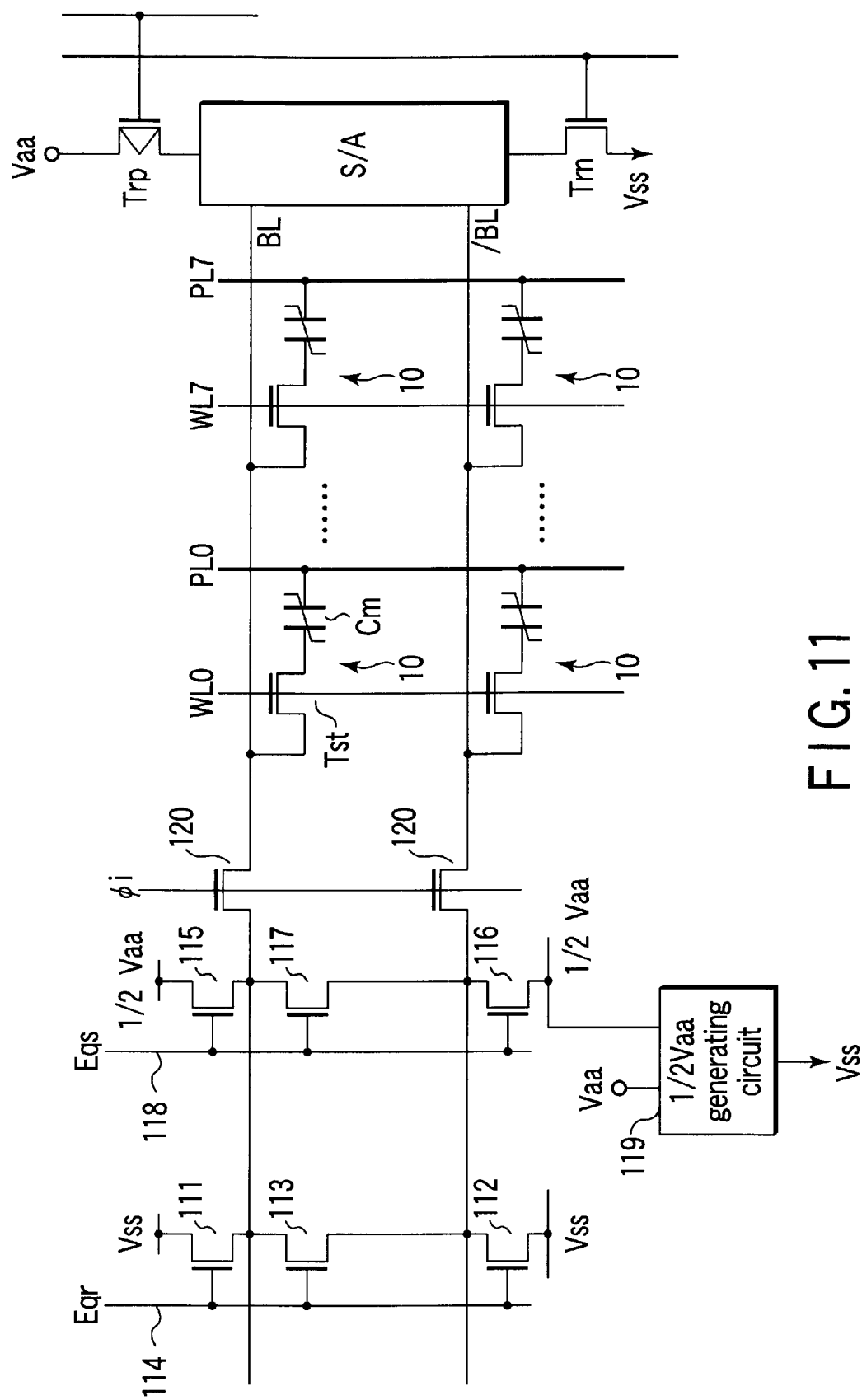
FIG. 11 is a circuit diagram showing part of the FeRAM according to a fourth embodiment of the first concept of the present invention, in particular, a circuit diagram showing in detail part of a cell array 11 in FIG. 1 and a write/readout circuit including a related low voltage write circuit 12.

FIG. 11 is a circuit diagram showing part of the FeRAM according to a fourth embodiment of the first concept of the present invention, in particular, a circuit diagram showing in detail part of a cell array 11 in FIG. 1 and a write/readout circuit including a related low voltage write circuit 12.

WL0 to WL7 designate the word lines, PL0 to PL7 designate the plate lines, BL and /BL designate a complementary pair of bit lines, S/A designates a sense amplifier connected to a pair of the bit lines BL, /BL, Trp designates a PMOS transistor for connecting the normal write voltage Vaa to the sense amplifier S/A and Trn designates a NMOS transistor for connecting ground potential Vss to the sense amplifier S/A.

Reference numerals 111 and 112 denote Vss pre-charge MOS transistors for connecting the pre-charge voltage (ground potential) Vss for the normal write operation to a pair of the bit lines BL, /BL selectively. Reference numeral 113 denotes a Vss equalizing MOS transistor connected between a pair of the bit lines BL and /BL. Reference numeral 114 denotes an equalizing signal line for supplying a pre-charge/equalizing signal Eqr to each gate of the Vss pre-charge MOS transistors 111, 112 and the Vss equalizing MOS transistor 113. The Vss pre-charge MOS transistors 111, 112, the Vss equalizing MOS transistor 113 and the equalizing signal line 114 form a normal write circuit which applies the Vss to a pair of the bit lines BL and /BL selectively.

Reference numeral 119 denotes a Vaa/2 generating circuit for generating Vaa/2 voltage by receiving normal write voltage Vaa and ground potential Vss. Reference numerals 115 and 116 denote Vaa/2 pre-charge MOS transistors for connecting low voltage write pre-charge voltage Vaa/2 to the bit lines BL, /BL selectively. Reference numeral 117 denotes a Vaa/2 equalizing MOS transistor connected between a pair of the bit lines BL, /BL. Reference numeral 118 denotes a pre-charge/equalizing signal line for supplying a pre-charge/equalizing signal Eqs to each gate of the Vaa/2 pre-charge MOS transistors 115, 116 and the Vaa/2 equalizing MOS transistor 117. The Vaa/2 generating circuit 119, the Vaa/2 pre-charge MOS transistors 115 and 116, the Vaa/2 equalizing MOS transistor 117 and the pre-charge/equalizing signal line 118 form a low voltage write circuit which applies the Vaa/2 voltage to a pair of the bit lines BL, /BL.

Reference numeral 120 denotes a MOS transistor for transfer gate which is inserted in each bit line BL, /BL in series between the aforementioned normal write circuit, the low voltage write circuit and a cell block 20 and controlled by a gate control signal φi.

In order to pre-charge a pair of the bit lines BL, /BL to Vss at the normal write operation time, the pre-charge/equalizing signal Eqs is inactivated so as to turn off the respective transistors 115, 116 and 117 in the low voltage write circuit. On the other hand, the pre-charge/equalizing signal Eqr is activated so as to turn on the respective transistors 111, 112 and 113 at the normal write circuit.

In order to pre-charge a pair of the bit lines BL, /BL to Vaa/2 at the time of low voltage write operation, the pre-charge/equalizing signal Eqr is inactivated so as to turn off the respective transistors 111, 112 and 113 and on the other hand, the pre-charge/equalizing signal Eqs is activated so as to turn on the respective transistors 115, 116 and 117 of the low voltage write circuit.

<Fifth Embodiment of the First Concept of the Invention>

Figure 12:
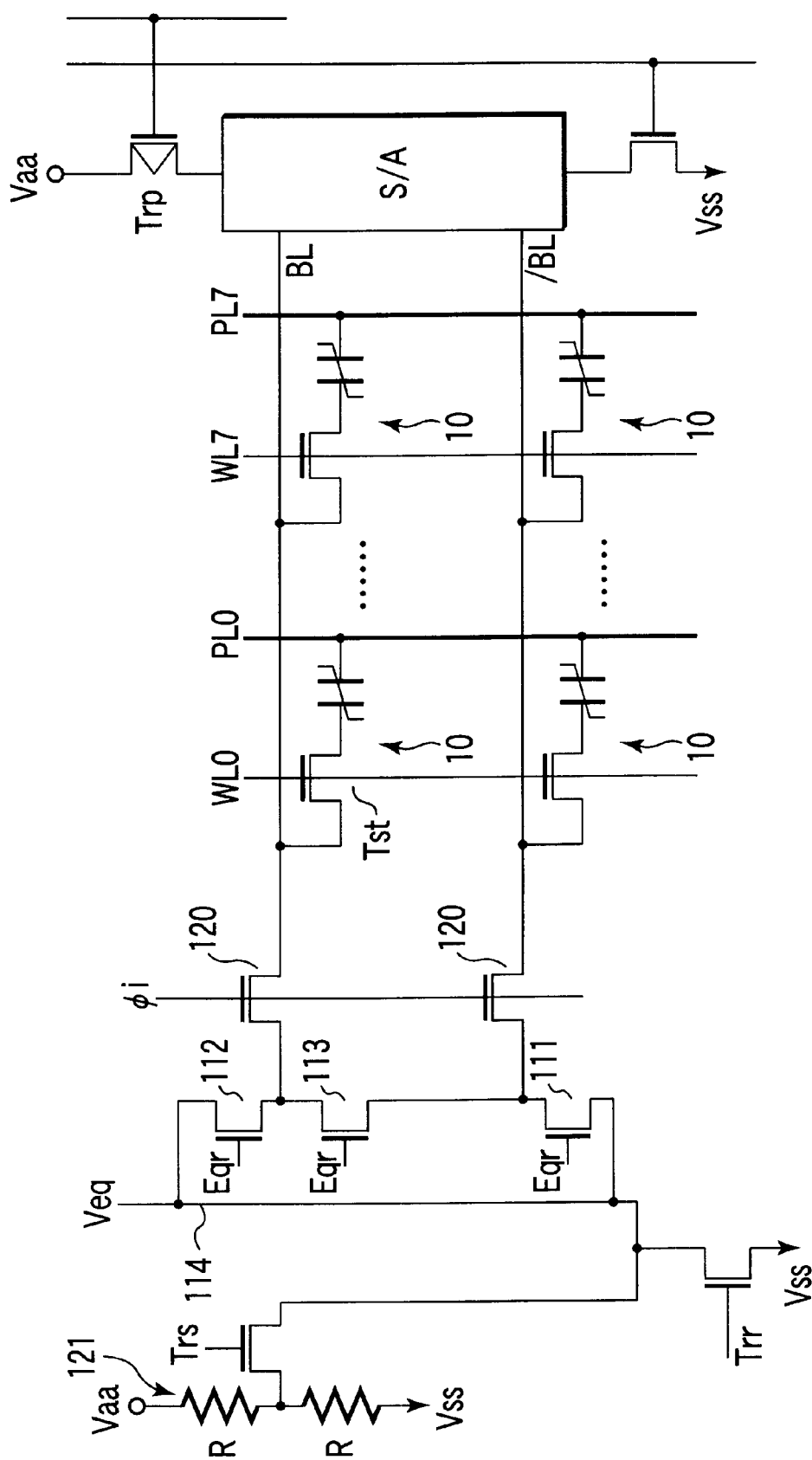
FIG. 12 is a circuit diagram showing part of the FeRAM according to a fifth embodiment of the first concept of the present invention, in particular, a circuit diagram showing in detail part of a cell array 11 in FIG. 1 and a write/readout circuit including a related low voltage write circuit 12.

FIG. 12 is a circuit diagram showing part of the FeRAM according to a fifth embodiment of the first concept of the present invention, in particular, a circuit diagram showing in detail part of a cell array 11 in FIG. 1 and a write/readout circuit including a related low voltage write circuit 12. The circuit shown in FIG. 12 is different from the aforementioned circuit shown in FIG. 11 in the low voltage write circuit, while the others are the same. The same reference numerals as FIG. 11 are attached to the same components.

Symbol Trr denotes a normal operation NMOS transistor for connecting the equalizing signal line 114 of the normal write circuit supplied with the pre-charge/equalizing signal Eqr to the ground potential Vss.

A Vaa/2 generating circuit 121 is a voltage divider circuit for generating the Vaa/2 voltage by dividing the normal write voltage Vaa with two voltage dividing resistors R, R. Symbol Trs denotes a NMOS transistor for connecting the aforementioned Vaa/2 voltage selectively to the equalizing signal line 114 and a pair of the bit lines BL, /BL. The Vaa/2 generating circuit 121 and the NMOS transistor Trs form a low voltage write circuit.

In order to pre-charge a pair of the bit lines BL, /BL to Vss at the normal write operation time, the NMOS transistor Trs of the low voltage write circuit is turned off while the NMOS transistor Trr for the normal write operation is turned on and the pre-charge/equalizing signal Eqr is activated so as to turn on the respective transistors 111, 112 and 113 of the write circuit.

In order to pre-charge a pair of the bit lines BL, /BL to Vaa/2 at the time of low voltage write operation, the NMOS transistor Trr for the normal write operation is turned off while the NMOS transistor Trs of the low voltage write circuit is turned on so as to turn on the respective transistors 111, 112 and 113 of the write circuit.

Figure 13:
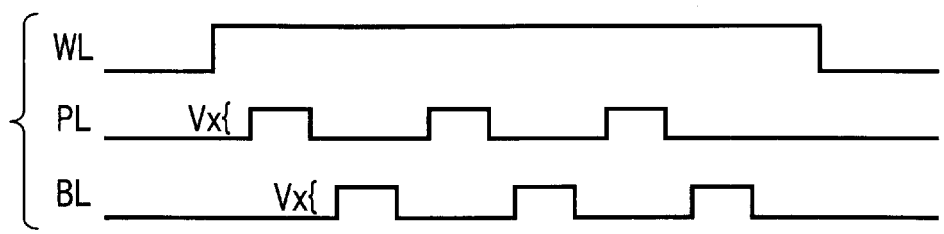
FIG. 13 is a timing signal diagram showing an example of low voltage write operation of the FeRAM of the fourth embodiment of FIG. 11 or the fifth embodiment of FIG. 12.

FIG. 13 is a timing signal diagram showing an example of the low voltage write operation to the FeRAM cell by using the low voltage write circuit of the FeRAM of the fourth embodiment of FIG. 11 or the fifth embodiment of FIG. 12.

Of the word lines WL0 to WL7, only one (for example, word line WL0) corresponding to a selected cell is set to "H" level while the other word lines are set to "L" level. Therefore, a MOS transistor Tm of a cell connected to the selected word line WL0 or the selected cell is turned on while MOS transistors Tm of the cells connected to non-selected word lines WL1 to WL7 or the non-selected cell are turned off. Consequently, the cell capacitor of a cell whose gate is connected to the selected word line WL0 is connected between the bit lines BL, /BL and the plate line PL0.

Just before heat process is applied to the FeRAM or, for example, before assembly process after the screening test at the wafer stage is ended or before shipment of a product after the screening test prior to the shipment is ended, the low voltage Vx is applied to the plate line PL0 or all the bit lines BL through the aforementioned low voltage write circuit with all cells in the same row (for example, row of the word line WL0) of all cell blocks of a cell array selected at the same time.

When the selected word line WL0 set to "H" level, the pulse voltage VPL (=Vx) is applied to the plate line PL0, "0" data having a small polarization amount is set up. On the contrary, when the pulse voltage Vb (=Vx) is applied to the bit lines BL, /BL, data "1" having a small polarization amount is set up.

If the aforementioned voltage pulse Vx is applied several times in a period in which the word line WL0 is set to "H" level as shown in FIG. 13, it is possible to set up the aforementioned data having a small polarization amount more securely.

With such an operation, cells in the same row in all cell blocks of the cell array can be selected, thereby making it possible to keep test time short even if the memory capacity is increased.

<Sixth Embodiment of the First Concept of the Invention>

Figure 14:
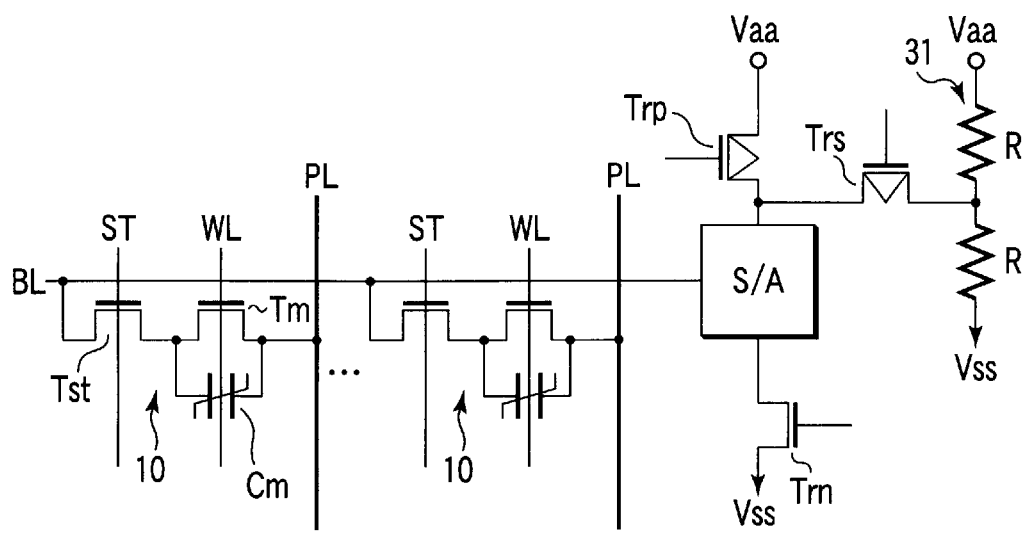
FIG. 14 is a circuit diagram showing part of the FeRAM according to a sixth embodiment of the first concept of the present invention, in particular, a circuit diagram showing in detail part of a cell array 11 in FIG. 1 and a write/readout circuit including a related low voltage write circuit 12.

FIG. 14 is a circuit diagram showing part of the FeRAM according to a sixth embodiment of the first concept of the present invention, in particular, a circuit diagram showing in detail part of a cell array 11 in FIG. 1 and a write/readout circuit including a related low voltage write circuit 12. A circuit shown in FIG. 14 is different in the structure of FeRAM from the aforementioned circuit of the first embodiment shown in FIG. 3, while the others are the same. The same reference numerals as FIG. 3 are attached to the same components.

Figure 15:
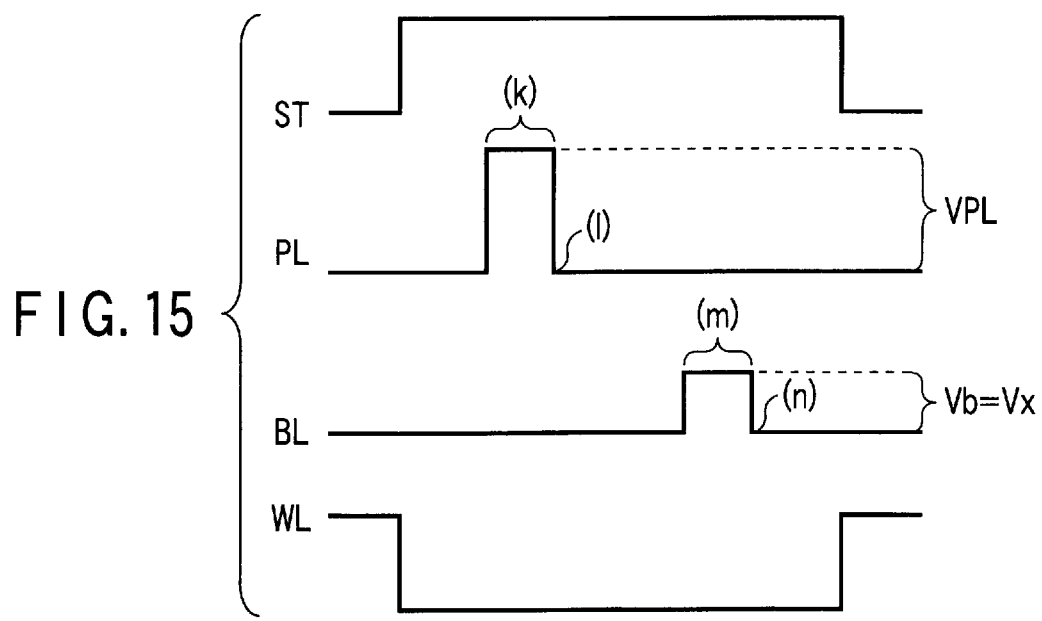
FIG. 15 is a timing signal diagram showing an example of the operation of the low voltage write circuit shown in FIG. 14.

FIG. 15 is a timing signal diagram showing an example of the low voltage write operation to the FeRAM cell by using the low voltage write circuit of the FeRAM of FIG. 14.

In FIG. 14, reference numeral 10 denotes a FeRAM cell, symbol Tst denotes a cell selecting transistor, symbol ST denotes a cell selecting signal line, symbol BL denotes a bit line, symbol WL denotes a word line and symbol PL denotes a plate line. Symbol S/A denotes a sense amplifier connected to the bit line BL, symbol Trp denotes a PMOS transistor for selectively connecting a normal write voltage Vaa to the sense amplifier S/A, and symbol Trn denotes a NMOS transistor for connecting ground potential Vss to the sense amplifier S/A.

The FeRAM cell 10 is a TC parallel connection type unit cell, in which a switching MOS cell transistor Tm is connected to the ferroelectric capacitor Cm in parallel. The TC parallel connection type unit cell has been described in detail in, for example, U.S. Pat. No. 5,903,492 (Daisaburo Takashima).

A source (plate electrode side of the ferroelectric capacitor Cm) of the switching MOS transistor Tm is connected to the plate line PL and a drain (storage electrode side of the ferroelectric capacitor Cm) of the switching MOS transistor Tm is connected to the bit line BL through the cell selection transistor Tst. A gate of the switching MOS transistor Tm is connected to the word line WL. A gate of the cell selection transistor Tst is connected to the cell selection signal line ST.

Reference numeral 31 denotes a voltage divider circuit for generating for example, a Vaa/2 voltage by dividing the normal write voltage Vaa with two voltage dividing resistors R, R, and symbol Trs denotes a PMOS transistor for selectively connecting the Vaa/2 voltage to the sense amplifier S/A. The voltage divider circuit 31 and the PMOS transistor Trs form a low voltage write circuit in which the Vaa/2 voltage is applied selectively to the bit line BL through the sense amplifier S/A.

In order to apply the Vaa voltage to the bit line BL through the sense amplifier S/A at the normal write time, the PMOS transistor Trs is turned off and the PMOS transistor Trp is turned on.

In order to apply a Vaa/2 pulse voltage to the bit line BL through the sense amplifier S/A at the low voltage write time, the PMOS transistor Trp is turned off and the PMOS transistor Trs is turned on.

The timing signal diagram of FIG. 15 shows an example of the low voltage write operation to the FeRAM cell by using the low voltage write circuit of the FeRAM of FIG. 14.

In this low voltage write operation, a pulse voltage Vb to be applied to the bit line BL is a low voltage Vx having an amplitude about ½ a voltage VPL to be applied to the plate line PL.

The operation will be described. As shown in FIG. 15, with the bit line BL pre-charged to 0V, the word line WL is set to "L" level to turn the switching MOS transistor Tm of the cell 10 off. On the other hand, the cell selection signal line ST is set to "H" level to turn the switching MOS transistor Tm of the cell 10 on. Next, the pulse voltage VPL is applied to the plate line PL. Consequently, irrespective of initial data, the polarization point of the FeRAM cell 10 is a polarization point "d" in FIG. 2 in a pulse voltage VPL application period (k) and when application of the pulse voltage VPL is ended at (l) in FIG. 15, it becomes a polarization point "e" in FIG. 2, so that data "0" having a normal polarization amount is presented.

After that, the pulse voltage Vb (=Vx) is applied to the bit line BL. As a result, the polarization point of the FeRAM cell 10 becomes a polarization point "i" in FIG. 2 in the pulse voltage Vb application period (m) and when application of the pulse voltage Vb is ended at (n) in FIG. 15, it becomes a polarization point "j" in FIG. 2, so that data "1" having a small polarization amount is presented.

At this time, if the cell selecting lines ST of all the cells 10 connected to the bit line BL applied with the pulse voltage Vb are selected, all those cells are accessed, thereby shortening the time required for polarization of all of the cells.

<Seventh Embodiment of the First Concept of the Invention>

Figure 16:
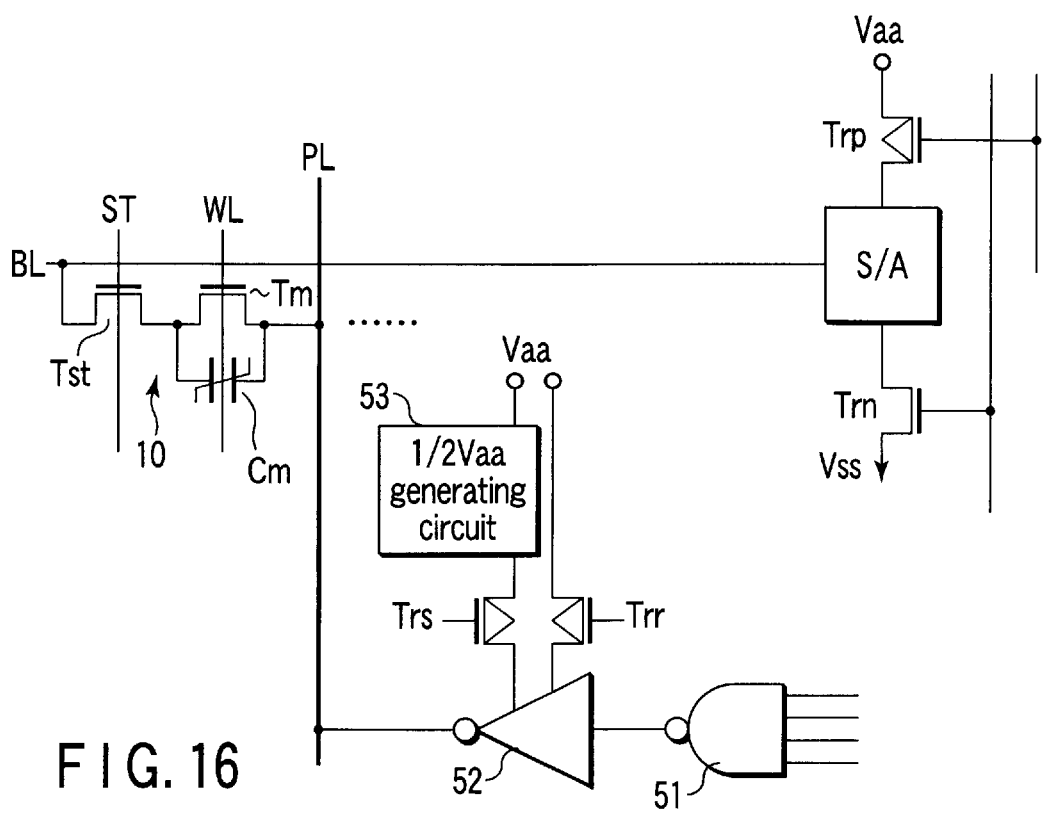
FIG. 16 is a circuit diagram showing part of the FeRAM according to a seventh embodiment of the first concept of the present invention, in particular, a circuit diagram showing in detail part of a cell array 11 in FIG. 1 and a write/readout circuit including a related low voltage write circuit 12.

FIG. 16 is a circuit diagram showing part of the FeRAM according to a seventh embodiment of the first concept of the present invention, in particular, a circuit diagram showing in detail part of a cell array 11 in FIG. 1 and a write/readout circuit including a related low voltage write circuit 12. A circuit shown in FIG. 16 is different in the structure of FeRAM from the aforementioned circuit of the second embodiment shown in FIG. 5, while the others are the same. The same reference numerals as FIG. 5 are attached to the same components.

Figure 17:
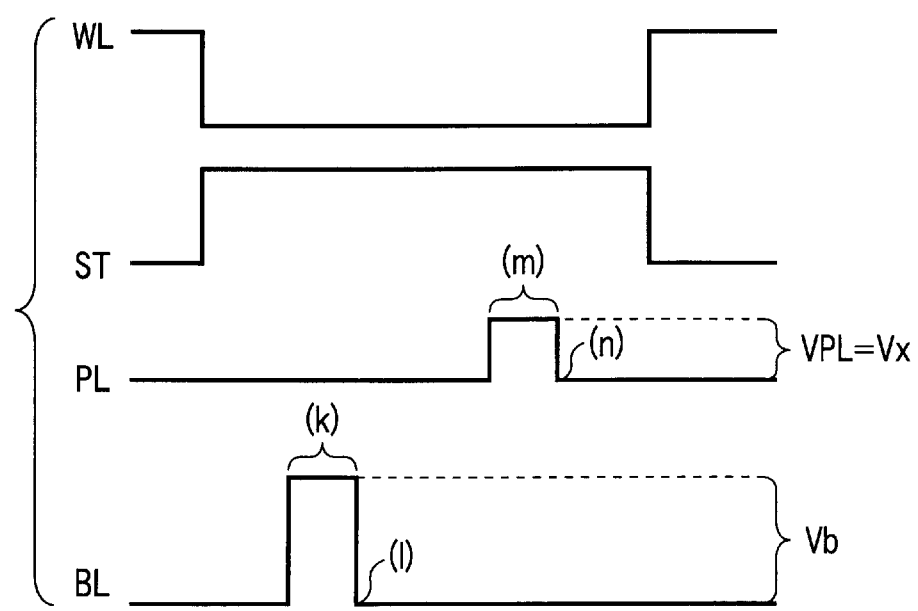
FIG. 17 is a timing signal diagram showing part of the operation of the low voltage write circuit of FIG. 16.

FIG. 17 is a timing signal diagram showing an example of the low voltage write operation to the FeRAM cell by using the low voltage write circuit of the FeRAM of FIG. 16.

In FIG. 16, reference numeral 10 denotes a FeRAM cell, symbol BL denotes a bit line, symbol Tst denotes a cell selecting transistor, symbol ST denotes a cell selecting signal line, symbol WL denotes a word line and symbol PL denotes a plate line. Symbol S/A denotes a sense amplifier connected to the bit line BL, symbol Trp denotes a PMOS transistor for selectively connecting a normal write voltage Vaa to the sense amplifier S/A, and symbol Trn denotes a NMOS transistor for connecting ground potential Vss to the sense amplifier S/A.

The FeRAM cell 10 is a TC parallel connection type unit cell, in which a switching MOS cell transistor Tm is connected to the ferroelectric capacitor Cm in parallel. The TC parallel connection type unit cell has been described in detail in, for example, U.S. Pat. No. 5,903,492 (Daisaburo Takashima).

A source (plate electrode side of the ferroelectric capacitor Cm) of the switching MOS transistor Tm is connected to the plate line PL and a drain (storage electrode side of the ferroelectric capacitor Cm) of the switching MOS transistor Tm is connected to the bit line BL through the cell selection transistor Tst. A gate of the switching MOS transistor Tm is connected to the word line WL. A gate of the cell selection transistor Tst is connected to the cell selection signal line ST.

Reference numeral 51 denotes a plate line decoder circuit for selecting a plate line, reference numeral 52 denotes a plate line driving circuit, which is driven by output of the plate line decoder circuit 51 so as to supply a plate voltage VPL to the plate line PL, and symbol Trr denotes a PMOS transistor for connecting a normal write voltage Vaa selectively to the plate line driving circuit 52. Reference numeral 53 denotes a Vaa/2 generating circuit for generating a Vaa/2 voltage by receiving the normal write voltage Vaa. Symbol Trs denotes a PMOS transistor for connecting the aforementioned Vaa/2 voltage selectively to the plate line driving circuit 52. The Vaa/2 generating circuit 53 and the PMOS transistor Trs form a low voltage write circuit which applies the Vaa/2 voltage selectively to the plate line PL.

In order to apply the Vaa voltage to the plate line PL at the normal write time, the PMOS transistor Trs is turned off while the PMOS transistor Trr is turned on.

In order to apply the pulse voltage of Vaa/2 to the plate line PL at the low voltage write time, the PMOS transistor Trr is turned off while the PMOS transistor Trs is turned on.

The timing signal diagram of FIG. 17 shows an example of the low voltage write operation to the FeRAM cell by using the low voltage write circuit of the FeRAM of FIG. 16.

In this low voltage write operation, it is preferable that a pulse voltage VPL to be applied to the plate line PL is a low voltage Vx having an amplitude about ½ a voltage Vb to be applied to the bit line BL.

The operation will be described. As shown in FIG. 17, with the plate line PL pre-charged to 0V, the word line WL is set to "L" level to turn the switching MOS transistor Tm of the cell 10 off. On the other hand, the cell selection signal line ST is set to "H" level to turn the cell selecting MOS transistor Tst of the cell 10 on. Next, the pulse voltage Vb is applied to the bit line BL. Consequently, irrespective of initial data, the polarization point of the FeRAM cell 10 is a polarization point "f" in FIG. 2 in a pulse voltage Vb application period (k) and when application of the pulse voltage Vb is ended at (l) in FIG. 17, it becomes a polarization point "c" in FIG. 2, so that data "1" having a normal polarization amount is presented.

After that, the pulse voltage VPL (=Vx) is applied to the plate line PL. As a result, the polarization point of the FeRAM cell 10 becomes a polarization point "g" in FIG. 2 in the pulse voltage VPL application period (m) and when application of the pulse voltage VPL is ended at (n) in FIG. 17, it becomes a polarization point "h" in FIG. 2, so that data "0" having a small polarization amount is presented.

<Eighth Embodiment of the First Concept of the Invention>

Figure 18:
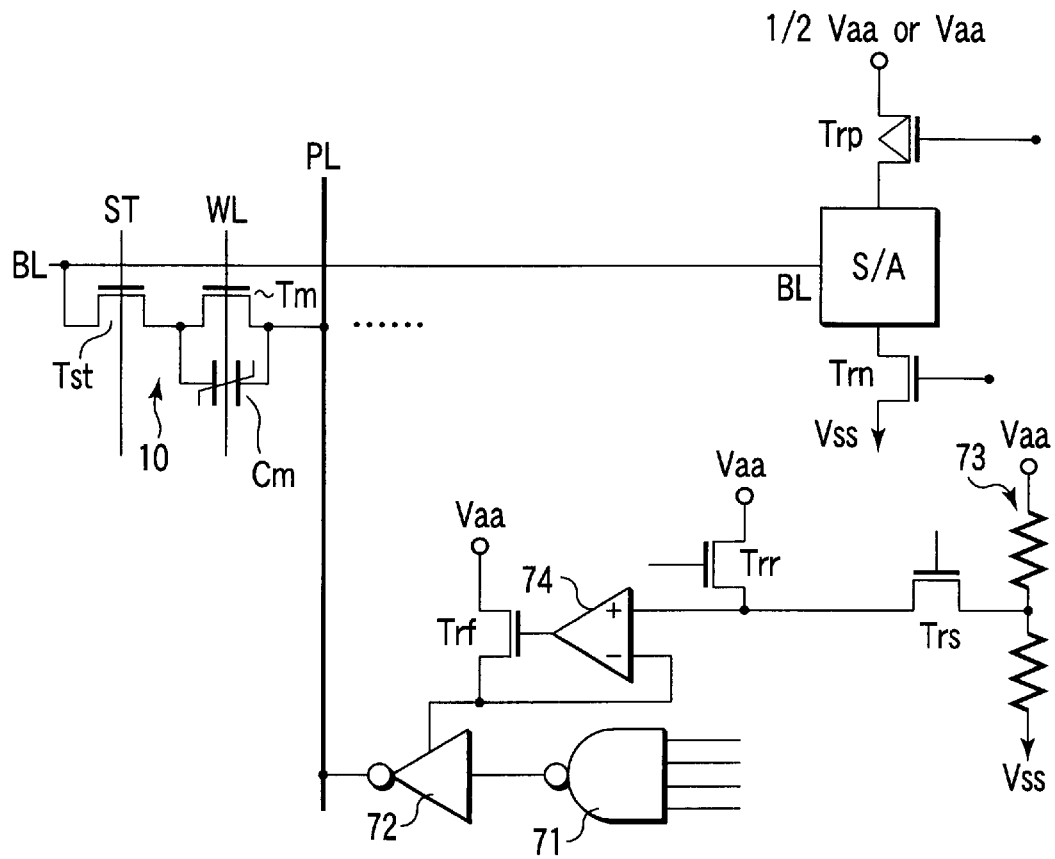
FIG. 18 is a circuit diagram showing part of the FeRAM according to an eighth embodiment of the first concept of the present invention, in particular, a circuit diagram showing in detail part of a cell array 11 in FIG. 1 and a write/readout circuit including a related low voltage write circuit 12.

FIG. 18 is a circuit diagram showing part of the FeRAM according to an eighth embodiment of the first concept of the present invention, in particular, a circuit diagram showing in detail part of a cell array 11 in FIG. 1 and a write/readout circuit including a related low voltage write circuit 12. A circuit shown in FIG. 18 is different in the structure of FeRAM from the aforementioned circuit of the third embodiment shown in FIG. 7, while the others are the same. The same reference numerals as FIG. 7 are attached to the same components.

Figure 19:
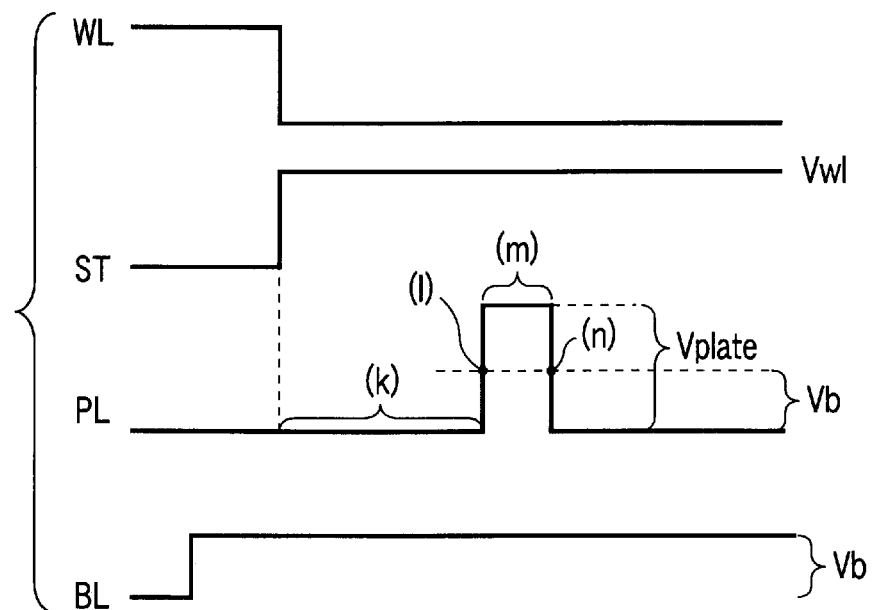
FIG. 19 is a timing signal diagram showing an example of the operation of the low voltage write circuit of FIG. 18.

FIG. 19 is a timing signal diagram showing an example of the low voltage write operation to the FeRAM cell by using the low voltage write circuit of the FeRAM of FIG. 18.

In FIG. 18, reference numeral 10 denotes a FeRAM cell, symbol BL denotes a bit line, symbol Tst denotes a cell selecting transistor, symbol ST denotes a cell selecting signal line, symbol WL denotes a word line and symbol PL denotes a plate line. Symbol S/A denotes a sense amplifier connected to the bit line BL, symbol Trp denotes a PMOS transistor for selectively connecting a normal write voltage Vaa or a low voltage write voltage Vaa/2 to the sense amplifier S/A, and symbol Trn denotes a NMOS transistor for connecting ground potential Vss to the sense amplifier S/A. The PMOS transistor Trp and the NMOS transistor Trn form a circuit for applying the normal write voltage Vaa and the low voltage write voltage Vaa/2 to the bit line BL through the sense amplifier S/A.

The FeRAM cell 10 is a TC parallel connection type unit cell, in which a switching MOS cell transistor Tm is connected to the ferroelectric capacitor Cm in parallel.

A source (plate electrode side of the ferroelectric capacitor Cm) of the switching MOS transistor Tm is connected to the plate line PL and a drain (storage electrode side of the ferroelectric capacitor Cm) of the switching MOS transistor Tm is connected to the bit line BL through the cell selection transistor Tst. A gate of the switching MOS transistor Tm is connected to the word line WL. A gate of the cell selection transistor Tst is connected to the cell selection signal line ST.

Reference numeral 71 denotes a plate line decoder circuit for selecting a plate line and reference 72 denotes a plate line driving circuit which is driven by output of the plate line decoder circuit 71 so as to supply the plate voltage VPL to the plate line PL.

Reference numeral 73 denotes a voltage divider circuit (Vaa/2 generating circuit) for generating the low voltage write voltage Vaa/2 by dividing the normal write voltage Vaa with two voltage dividing resistors R, R, reference numeral 74 denotes a voltage comparing circuit, a symbol Trr denotes a MOS transistor for connecting the normal write voltage Vaa to one input node (+) of the voltage comparing circuit 74 selectively and symbol Trs denotes a MOS transistor for connecting the low voltage write voltage Vaa/2 to one input node (+) of the voltage comparing circuit 74 selectively.

Symbol Trf denotes a MOS transistor for feedback control, in which the normal write voltage Vaa is applied to its source, its gate is connected to an output node of the voltage comparing circuit 74, and its drain is connected to the other input node (−) of the voltage comparing circuit 74 and connected to an operating power node of the plate line driving circuit 72.

The Vaa/2 generating circuit 73, the MOS transistors Trs and Trs, the voltage comparing circuit 74, the MOS transistor Trf, and the plate line driving circuit 72 form a circuit which applies the normal write voltage Vaa or the low voltage write voltage Vaa/2 selectively to the plate line PL.

In order to apply the Vaa voltage to the plate line PL at the normal write time, the PMOS transistor Trs is turned off while the PMOS transistor Trr is turned on.

In order to apply the pulse voltage of Vaa/2 to the plate line PL at the low voltage write time, the PMOS transistor Trr is turned off while the PMOS transistor Trs is turned on.

The timing signal diagram of FIG. 19 shows an example of the low voltage write operation to the FeRAM cell by using the low voltage write circuit of the FeRAM of FIG. 18.

In this low voltage write operation, the bit line pre-charge voltage Vb is a voltage having an amplitude about ½ the pulse voltage VPL applied to the plate line PL.

The operation will be described. With the bit line BL pre-charged to the bit line pre-charge voltage Vb (about ½ VPL) as shown in FIG. 19, the word line voltage Vwl is set to "L" level to turn the switching MOS transistor Tm of the cell 10 off. On the other hand, the cell selection signal line ST is set to "H" level to turn the cell selecting MOS transistor Tst of the cell 10 on. Consequently, the polarization point of the FeRAM cell 10 becomes the polarization point "i" in FIG. 2 in the period (k) after the word line WL is selected. After that, the pulse voltage VPL is applied to the plate line PL one or more. When the pulse voltage VPL becomes equal to the bit line voltage Vb at (l) in FIG. 19, the polarization point of the FeRAM cell 10 becomes the polarization point "j" in FIG. 2. The polarization point of the FeRAM cell 10 becomes the polarization point "g" in FIG. 2 in the pulse voltage VPL application period (m) and when the pulse voltage VPL becomes equal to the bit voltage Vb at (n) in FIG. 19, the polarization point becomes the polarization point "h" in FIG. 2.

As described above, with a fixed voltage of about ½ VPL applied to the bit line BL, when the pulse voltage VPL is applied to the plate line PL one or more, then data write into the FeRAM cell 10 is carried out at a voltage about ½ at the normal write time. Therefore, the polarization amount in the ferroelectric capacitor is smaller than the polarization amount at the normal write time.

Figure 20:
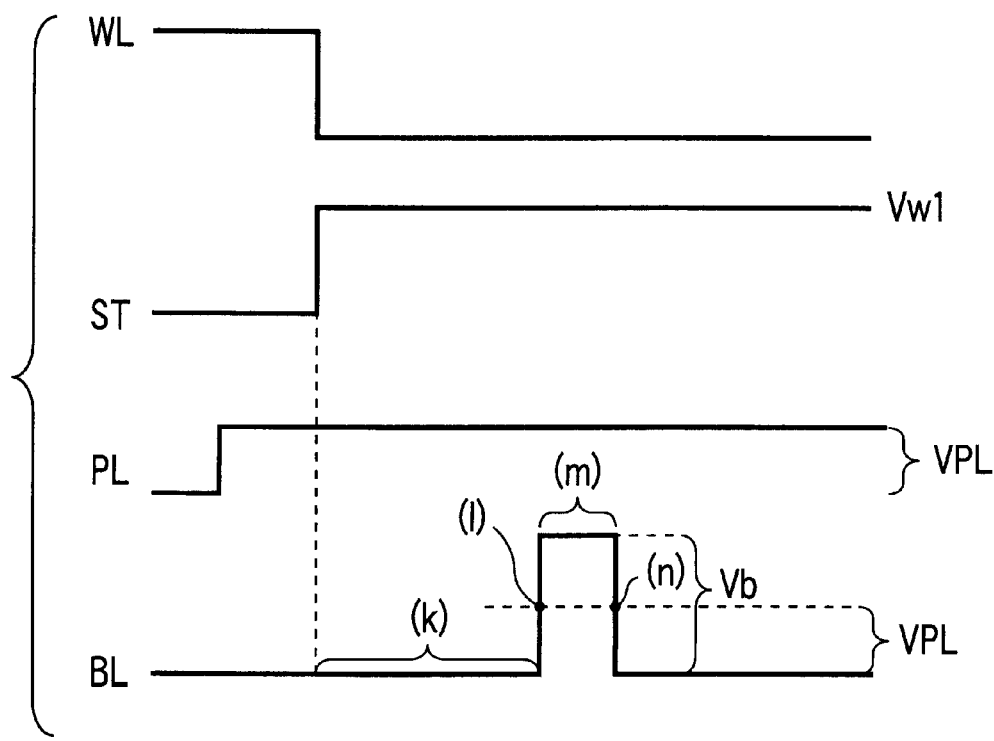
FIG. 20 is a timing signal diagram showing other example of the operation of the low voltage write circuit of FIG. 18.

FIG. 20 shows a timing signal diagram of another example of the low voltage write operation to the FeRAM cell by using the low voltage write circuit of the FeRAM of FIG. 18.

In this low voltage write operation, the pulse voltage VPL applied to the plate line PL is a voltage having an amplitude about ½ the pulse voltage Vb applied to the bit line BL.

The operation will be described. With the plate line PL pre-charged to the plate line pre-charge voltage VPL (about ½ Vb) as shown in FIG. 20, the word line voltage Vwl is set to "L" level to turn the switching MOS transistor Tm of the cell 10 off. On the other hand, the cell selection signal line ST is set to "H" level to turn the cell selecting MOS transistor Tst of the cell 10 on. Consequently, the polarization point of the FeRAM cell 10 becomes the polarization point "g" in FIG. 2 in the period (k) after the word line WL is selected. After that, the pulse voltage Vb is applied to the bit line BL one or more. When the bit line pulse voltage Vb becomes the pulse voltage VPL equal to at (l) in FIG. 20, the polarization point of the FeRAM cell 10 becomes the polarization point "h" in FIG. 2. The polarization point of the FeRAM cell 10 becomes the polarization point "i" in FIG. 2 in the pulse voltage Vb application period (m) and when the pulse voltage Vb becomes equal to the pulse voltage VPL at (n) in FIG. 20, the polarization point becomes the polarization point "j" in FIG. 2.

As described above, with a fixed voltage of about ½ VPL applied to the plate line PL, when the pulse voltage Vb is applied to the bite line BL one or more, then data write into the FeRAM cell 10 is carried out at a voltage about ½ at the normal write time. Therefore, the polarization amount in the ferroelectric capacitor is smaller than the polarization amount at the normal write time.

<Ninth Embodiment of the First Concept of the Invention>

Figure 21:
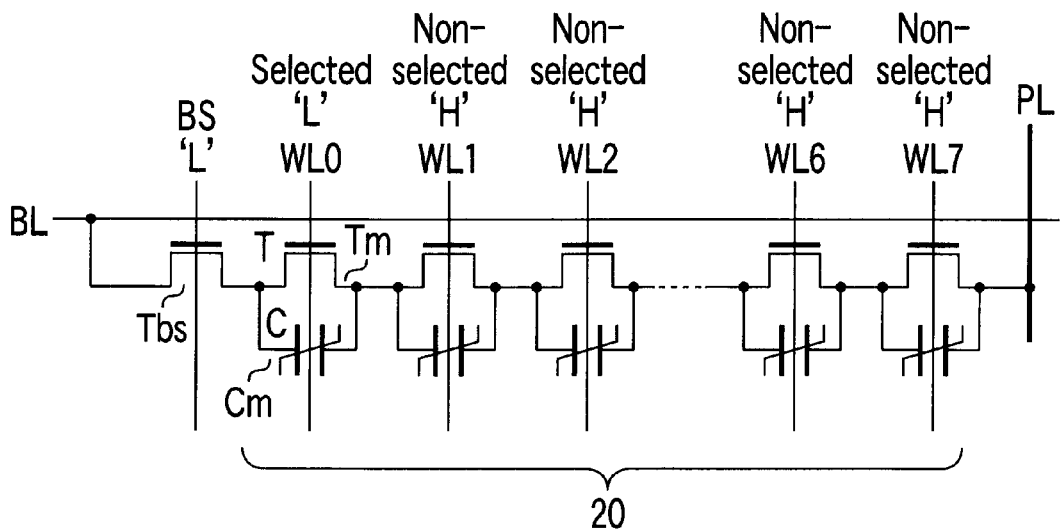
FIG. 21 is a circuit diagram showing a cell block in which a plurality of unit cells are connected in series.

FIG. 21 is a circuit diagram showing a cell block 20 formed of a plurality (eight in this embodiment) of TC parallel connection type unit cells. FIG. 21 shows only five TC parallel connection type unit cells for a representative.

The FeRAM cell 10 is a TC parallel connection type unit cell, in which a switching MOS cell transistor Tm is connected to the ferroelectric capacitor Cm in parallel.

A source (plate electrode side of the ferroelectric capacitor Cm) of the switching MOS transistor Tm is connected to the plate line PL and a drain (storage electrode side of the ferroelectric capacitor Cm) of the switching MOS transistor Tm is connected to the bit line BL through the cell selection transistor Tst. A gate of the switching MOS transistor Tm is connected to the word line WL. A gate of the cell selection transistor Tst is connected to the cell selection signal line ST.

The cell block 20 includes eight unit cells connected in series each in which the switching MOS cell transistor Tm is connected to the ferroelectric capacitor Cm in parallel. One terminal of the series-connected cells is connected to the plate line PL, while the other terminal thereof is connected to the bit line BL through the block selection transistor Tbs.

Then, a gate of the cell transistor Tm of each unit cell is connected to a corresponding one of the word lines WL0 to WL7, while a gate of a block selection transistor Tbs is connected to the block selecting line BS. A block selection signal is inputted to the block selecting line BS.

Figure 22:
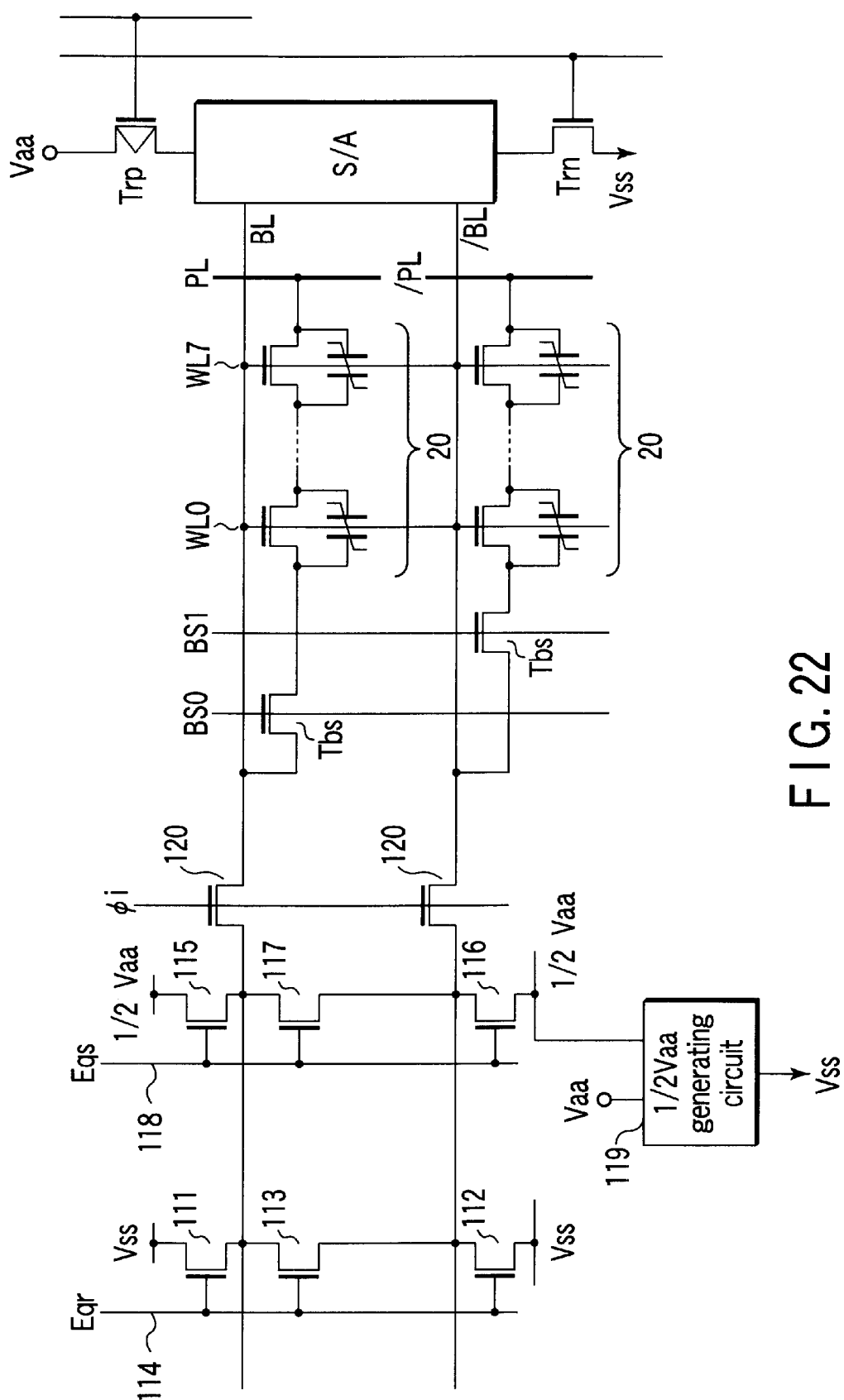
FIG. 22 is a circuit diagram showing part of the FeRAM according to a ninth embodiment of the first concept of the present invention, in particular, a circuit diagram showing in detail part of a cell array 11 in FIG. 1 and a write/readout circuit including a related low voltage write circuit 12.

FIG. 22 is a circuit diagram showing part of the FeRAM according to a ninth embodiment of the first concept of the present invention, in particular, a circuit diagram showing in detail part of a cell array 11 in FIG. 1 and a write/readout circuit including a related low voltage write circuit 12.

In FIG. 22, reference numeral 20 denotes a cell block and symbol Tbs denotes a block selecting transistor. WL0 to WL7 designate the word lines, PL0 to PL7 designate the plate lines, BL and /BL designate a complementary pair of bit lines, S/A designates a sense amplifier connected to a pair of the bit lines BL, /BL, Trp designates a PMOS transistor for connecting the normal write voltage Vaa to the sense amplifier S/A and Trn designates a NMOS transistor for connecting ground potential Vss to the sense amplifier S/A.

Reference numerals 111 and 112 denote Vss pre-charge MOS transistors for connecting the pre-charge voltage (ground potential) Vss for the normal write operation to a pair of the bit lines BL, /BL selectively. Reference numeral 113 denotes a Vss equalizing MOS transistor connected between a pair of the bit lines BL and /BL. Reference numeral 114 denotes an equalizing signal line for supplying a pre-charge/equalizing signal Eqr to each gate of the Vss pre-charge MOS transistors 111, 112 and the Vss equalizing MOS transistor 113. The Vss pre-charge MOS transistors 111, 112, the Vss equalizing MOS transistor 113 and the equalizing signal line 114 form a normal write circuit which applies the Vss to a pair of the bit lines BL and /BL selectively.

Reference numeral 119 denotes a Vaa/2 generating circuit for generating Vaa/2 voltage by receiving normal write voltage Vaa and ground potential Vss. Reference numerals 115 and 116 denote Vaa/2 pre-charge MOS transistors for connecting low voltage write pre-charge voltage Vaa/2 to the bit lines BL, /BL selectively. Reference numeral 117 denotes a Vaa/2 equalizing MOS transistor connected between a pair of the bit lines BL, /BL. Reference numeral 118 denotes a pre-charge/equalizing signal line for supplying a pre-charge/equalizing signal Eqs to each gate of the Vaa/2 pre-charge MOS transistors 115, 116 and the Vaa/2 equalizing MOS transistor 117. The Vaa/2 generating circuit 119, the Vaa/2 pre-charge MOS transistors 115 and 116, the Vaa/2 equalizing MOS transistor 117 and the pre-charge/equalizing signal line 118 form a low voltage write circuit which applies the Vaa/2 voltage to a pair of the bit lines BL, /BL.

Reference numeral 120 denotes a MOS transistor for transfer gate which is inserted in each bit line BL, /BL in series between the aforementioned normal write circuit, the low voltage write circuit and a cell block 20 and controlled by a gate control signal φi.

In order to pre-charge a pair of the bit lines BL, /BL to Vss at the normal write operation time, the pre-charge/equalizing signal Eqs is inactivated so as to turn off the respective transistors 115, 116 and 117 in the low voltage write circuit. On the other hand, the pre-charge/equalizing signal Eqr is activated so as to turn on the respective transistors 111, 112 and 113 at the normal write circuit.

In order to pre-charge a pair of the bit lines BL, /BL to Vaa/2 at the time of low voltage write operation, the pre-charge/equalizing signal Eqr is inactivated so as to turn off the respective transistors 111, 112 and 113 and on the other hand, the pre-charge/equalizing signal Eqs is activated so as to turn on the respective transistors 115, 116 and 117 of the low voltage write circuit.

<Tenth Embodiment of the First Concept of the Invention>

Figure 23:
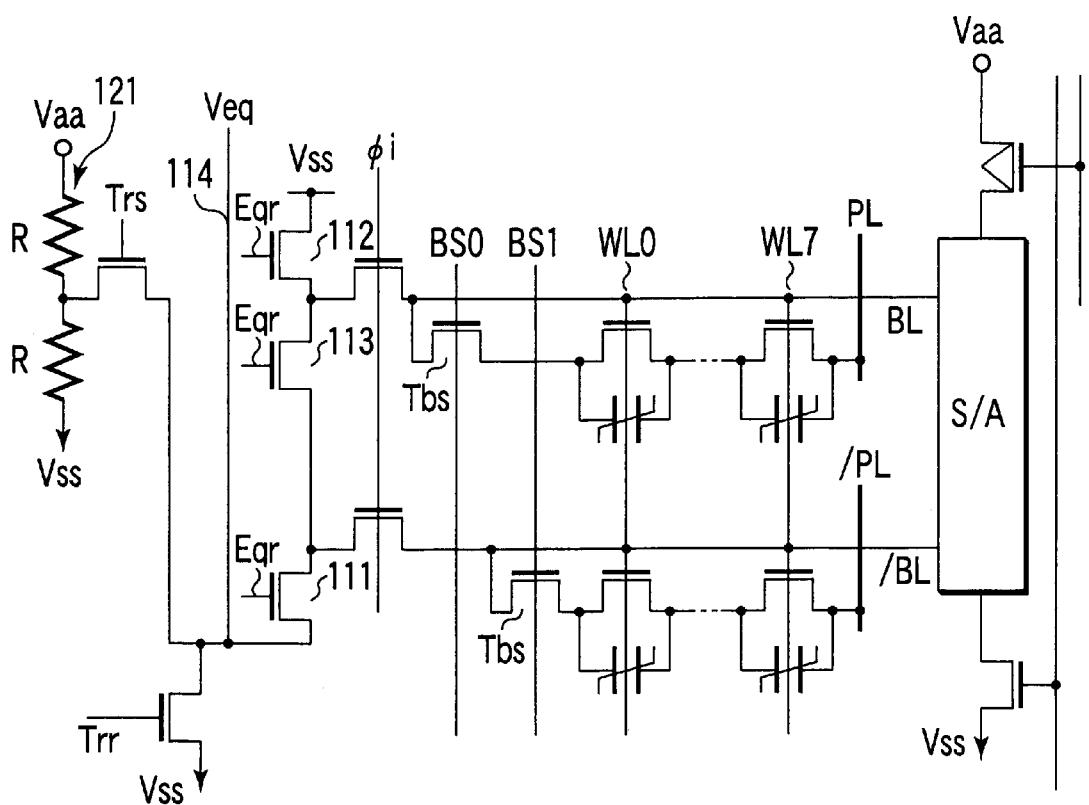
FIG. 23 is a circuit diagram showing part of the FeRAM according to a tenth embodiment of the first concept of the present invention, in particular, a circuit diagram showing in detail part of a cell array 11 in FIG. 1 and a write/readout circuit including a related low voltage write circuit 12.

FIG. 23 is a circuit diagram showing part of the FeRAM according to a tenth embodiment of the first concept of the present invention, in particular, a circuit diagram showing in detail part of a cell array 11 in FIG. 1 and a write/readout circuit including a related low voltage write circuit 12. A circuit shown in FIG. 23 is different in the structure of low voltage write circuit from the aforementioned circuit of the ninth embodiment shown in FIG. 22, while the others are the same. The same reference numerals as FIG. 22 are attached to the same components.

Symbol Trr denotes a normal operation NMOS transistor for connecting the equalizing signal line 114 of the normal write circuit supplied with the pre-charge/equalizing signal Eqr to the ground potential Vss.

A Vaa/2 generating circuit 121 is a voltage divider circuit for generating the Vaa/2 voltage by dividing the normal write voltage Vaa with two voltage dividing resistors R, R. Symbol Trs denotes a NMOS transistor for connecting the aforementioned Vaa/2 voltage selectively to the equalizing signal line 114 and a pair of the bit lines BL, /BL. The Vaa/2 generating circuit 121 and the NMOS transistor Trs form a low voltage write circuit.

In order to pre-charge a pair of the bit lines BL, /BL to Vss at the normal write operation time, the NMOS transistor Trs of the low voltage write circuit is turned off while the NMOS transistor Trr for the normal write operation is turned on and the pre-charge/equalizing signal Eqr is activated so as to turn on the respective transistors 111, 112 and 113 of the write circuit.

In order to pre-charge a pair of the bit lines BL, /BL to Vaa/2 at the time of low voltage write operation, the NMOS transistor Trr for the normal write operation is turned off while the NMOS transistor Trs of the low voltage write circuit is turned on so as to turn on the respective transistors 111, 112 and 113 of the write circuit.

Figure 24:
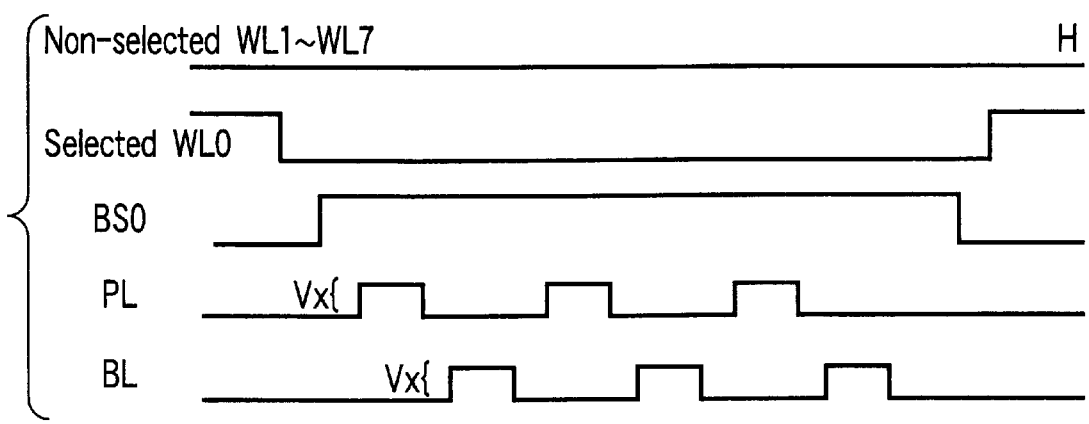
FIG. 24 is a timing signal diagram showing an example of the low voltage write operation of the FeRAM according to the ninth embodiment of FIG. 22 or the tenth embodiment of FIG. 23.

FIG. 24 is a timing signal diagram showing an example of the low voltage write operation to the FeRAM cell by using the low voltage write circuit of the FeRAM of the ninth embodiment of FIG. 22 or the tenth embodiment of FIG. 23.

Of the word lines WL0 to WL7, only one (for example, word line WL0) corresponding to a selected cell is set to "L" level while the other word lines are set to "H" level. Therefore, a MOS transistor Tm of a cell connected to the selected word line WL0 or the selected cell is turned off while MOS transistors Tm of the cells connected to non-selected word lines WL1 to WL7 or the non-selected cells are turned on. Then, the block selecting line (for example, BSO) is set to "H", so that the block selection transistor Tbs connected to the block selecting line BSO set to the "H" level is turned on. Consequently, the cell is selected and the cell capacitor Cm of the selected cell is connected between the bit line BL and the plate line PL.

Just before heat process is applied to the FeRAM or, for example, before assembly process after the screening test at the wafer stage is ended or before shipment of a product after the screening test prior to the shipment is ended, cells in the same row (for example, row of the word line WL0) of all cell blocks in a cell array are selected and all the block selecting lines BS are set to "H" level to turn all the block selecting transistors Tbs on. In this state, the low voltage Vx is applied to all the bit lines BL and plate lines PL through the aforementioned low voltage write circuit.

When the selected word line WL0 set to "L" level, the pulse voltage VPL (=Vx) is applied to the plate line PL, "0" data having a small polarization amount is set up. On the contrary, when the pulse voltage Vb (=Vx) is applied to the bit lines BL, /BL, data "1" having a small polarization amount is set up.

If the aforementioned voltage pulse Vx is applied several times in a period in which the word line WL0 is set to "L" level as shown in FIG. 24, it is possible to set up the aforementioned data having a small polarization amount more securely.

If the aforementioned pulse voltage VPL or pulse voltage Vb is applied several times in a period in which the block selecting transistor Tbs is turned on, it is possible to set up the aforementioned data having a small polarization amount more securely.

With such an operation, cells in the same row in all cell blocks of the cell array can be selected, thereby making it possible to keep test time short even if the memory capacity is increased.

<Second Concept of the Invention>

Figure 25:
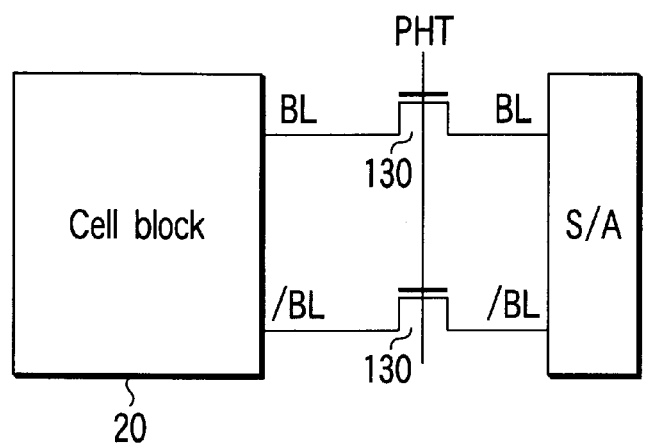
FIG. 25 is a block diagram schematically showing part of the FeRAM according to the second concept of the present invention.
Figure 26:
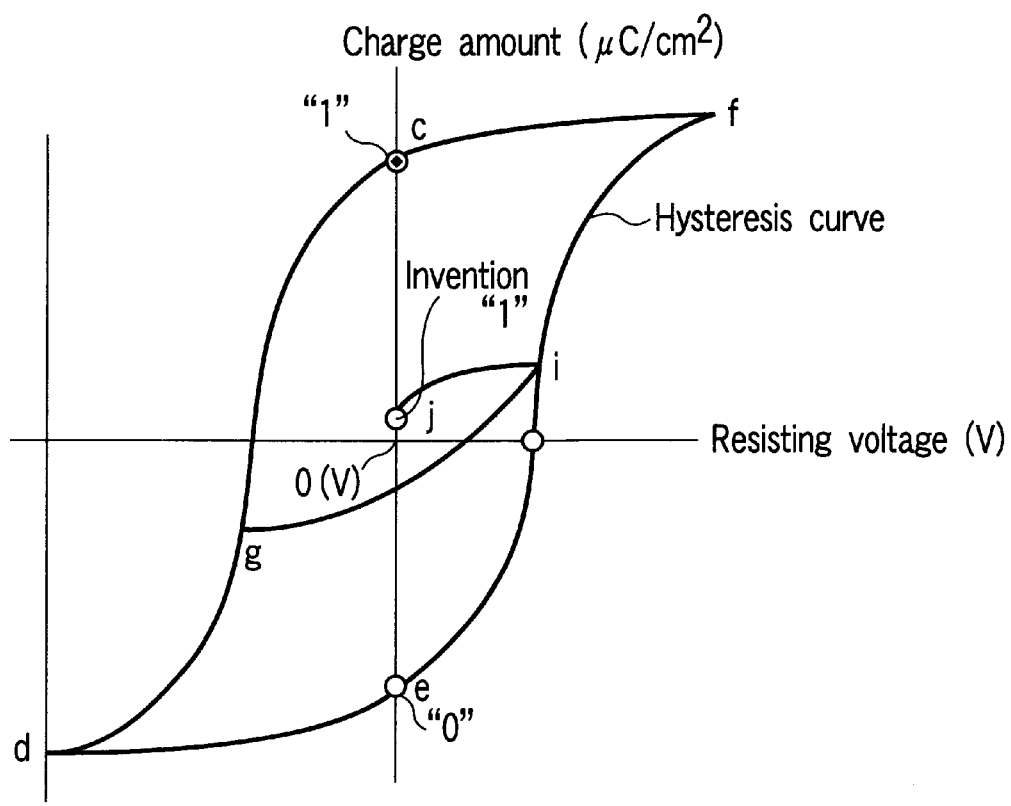
FIG. 26 is a hysteresis characteristic curve showing an example of the polarization state of the FeRAM cell for use in the FeRAM of FIG. 25.

FIG. 25 is a block diagram schematically showing part of the FeRAM according to a second concept of the present invention. FIG. 26 shows its hysteresis characteristic curve.

In the FeRAM according to the second concept of the present invention, a separating MOS transistor 130 is inserted between the cell block 20 and the sense amplifier S/A of the memory cell array. Upon low voltage write operation, a gate control signal PHT to be applied to a gate of the separating MOS transistor 130 is lowered from a high rise-up voltage Vpp (normal write voltage) to a low internal power source voltage Vaa. Consequently, "1" data write voltage in the bit lines /BL, BL on the cell array side is suppressed to Vaa−Vt (Vt: threshold voltage of the separating MOS transistor 130) in order to prevent generation of the imprint which is caused by heat, stress and the like to the cell array.

<First Embodiment of the Second Concept of the Invention>

Figure 27:
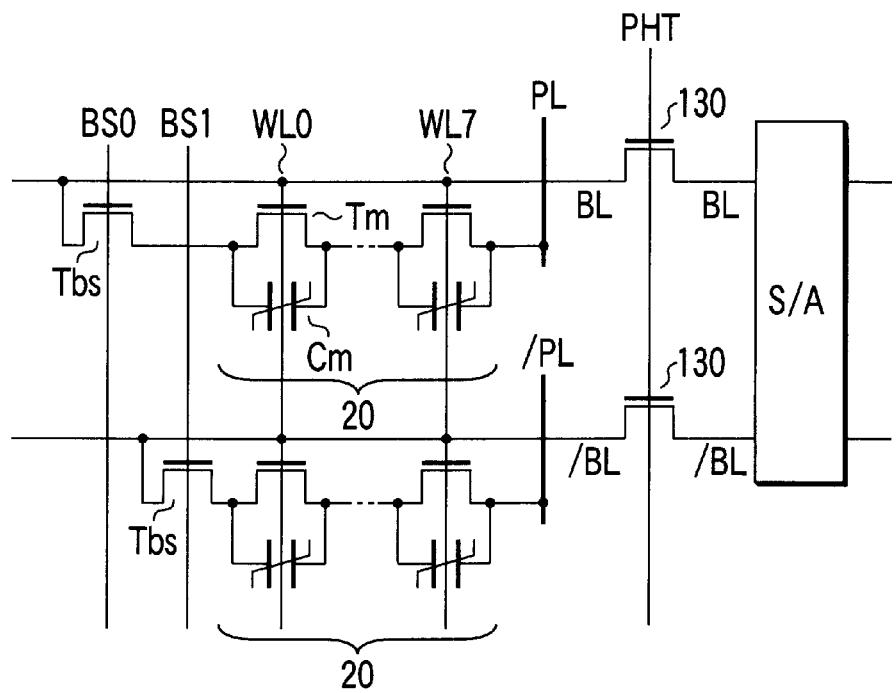
FIG. 27 is a circuit diagram showing part of a FeRAM according to a first embodiment of the second concept of the present invention.
Figure 28:
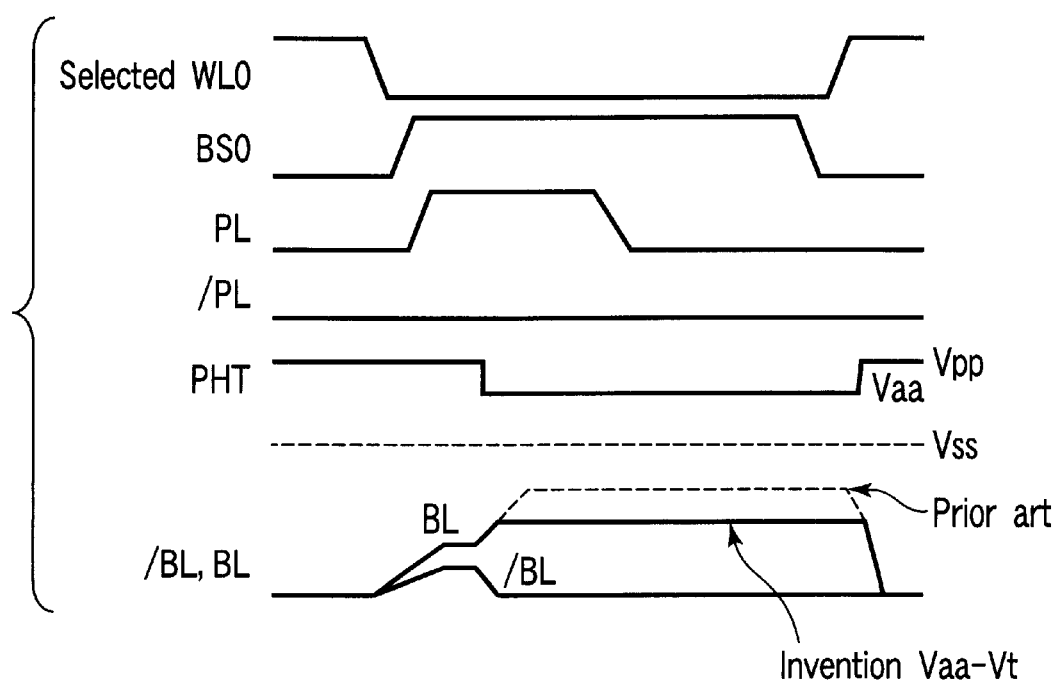
FIG. 28 is a timing signal diagram showing an example of the low voltage write operation of the FeRAM of FIG. 27.

FIG. 27 is a circuit diagram showing part of the FeRAM according to a first embodiment of the second concept of the present invention. FIG. 28 is a timing signal diagram showing an example of the low voltage write operation in the FeRAM shown in FIG. 27, according to the first embodiment of the second concept of the present invention.

In this embodiment, the cell block 20 is formed of eight parallel connection type unit cells each in which the ferroelectric capacitor Cm is connected between the source and drain of the cell transistor Tm. Two unit cells are indicated with respect to a pair of the bit lines BL and /BL as a representative, respectively. One terminal of the series-connected cells is connected to the plate line PL while the other terminal thereof is connected to the bit line BL through the block selecting transistor Tbs.

The gate of the cell transistor Tm of each unit cell is connected to a corresponding one of the word lines WL0 to WL7 while the gate of the block selecting transistor Tbs is connected to the block selecting line BS. A block selection signal is inputted to the block selecting line BS.

According to this embodiment, as shown in FIG. 27, the separating MOS transistor 130 is inserted into a pair of the bit lines BL, /BL between the cell block 20 of the memory cell array and the sense amplifier S/A. That is, the separating MOS transistor 130 is inserted into the bit line BL between the cell block 20 and the sense amplifier S/A and the MOS transistor 130 is inserted into the bit line /BL between the cell block 20 and the sense amplifier S/A. A gate control signal is inputted to the separating MOS transistor 130 through the gate control signal line PHT. In the normal operation, the gate control signal PHT is set to "H" level or the high rise-up voltage Vpp and the cell block 20 is electrically connected to the sense amplifier S/A.

At the time of low voltage write operation, for example, at the time of write operation prior to packing process, the gate control signal voltage PHT to be applied to the separating MOS transistor 130 is lowered from the high rise-up voltage Vpp (normal write voltage) to the low internal power source voltage Vaa as shown in FIG. 28. Consequently, the potential between the bit line /BL and BL on the sense amplifier side is kept changing between the ground potential Vss and the internal power source potential Vaa, and in the bit lines /BL, BL on the cell array side, as shown in FIG. 28, the "1" data write voltage is lowered to Vaa−Vt (Vt: threshold voltage of the separating MOS transistor 130). Because the "1" data write voltage is lowered to Vaa−Vt at the low voltage write time, the imprint which may be caused by heat, stress or the like to the cell array is prevented. On the other hand, the potential between the bit lines /BL and BL on the sense amplifier side is separated from the potential between the bit lines /BL and BL on the cell array side, so that it is changed between he ground potential Vss and the internal power source potential Vaa, thereby preventing a write error.

If data stored in the cell is "1" data, in the low voltage operation shown in FIG. 28, the polarization point is changed from polarization point (c) to polarization points (g), (i), and (l) successively so that it becomes data "1" having a small polarization amount. On the other hand, if the data stored in the cell is "0" data, when data "1" is written from outside, the polarization point is changed from the polarization point (e) to polarization points (d), (i), and (l) successively, so that it becomes data "1" having a small polarization amount. In this embodiment also like the above-described embodiments, the polarization amount can be reduced thereby suppressing the problem of the imprint. Further, in this embodiment, the power source on the plate side and the bit line side do not need to be separated thereby leading to simplification of the structure. Further, according to this embodiment, it is not necessary to generate the potential on the plate line "H" level and the potential on the bit line "H" level, which are needed in the above described embodiments to realize the low voltage write operation.

<Second Embodiment of the Second Concept of the Invention>

FIG. 29 is a circuit diagram showing part of the FeRAM according to a second embodiment of the second concept of the present invention. FIG. 30 is a timing signal diagram showing an example of the low voltage write operation to the FeRAM cell by using the low voltage write circuit of the FeRAM of FIG. 29.

The circuit shown in FIG. 29 is different in the structure of FeRAM cell from the aforementioned circuit of the first embodiment shown in FIG. 27, while the others are the same. The same reference numerals as FIG. 27 are attached to the same components.

The FeRAM cell 10 is formed of a plurality (for example, eight) of unit cells. As a representative, two unit cells to a pair of the bit lines BL and /BL are illustrated.

The drain of the cell selecting transistor Tst of each FeRAM cell 10 is connected to the bit line BL or /BL, the gate of the cell selecting transistor Tst of each FeRAM cell 10 is connected to a corresponding one of the word lines WL0 to WL and one terminal (plate electrode) of the ferroelectric capacitor Cm of each FeRAM cell 10 is connected to a corresponding one of the plate lines PL0 to PL.

In this embodiment, as shown in FIG. 29, the separating MOS transistor 130 is inserted into a pair of the bit lines BL, /BL between the cell block 20 of the memory cell array and the sense amplifier S/A. That is, the separating MOS transistor 130 is inserted into the bit line BL between the cell block 20 and the sense amplifier S/A and the MOS transistor 130 is inserted into the bit line /BL between the cell block 20 and the sense amplifier S/A. A gate control signal is inputted to the separating MOS transistor 130 through the gate control signal line PHT. In the normal operation, the gate control signal PHT is set to "H" level or the high rise-up voltage Vpp and the cell block 20 is electrically connected to the sense amplifier S/A.

At the time of low voltage write operation, for example, at the time of write operation prior to packing process, the gate control signal voltage PHT to be applied to the separating MOS transistor 130 is lowered from the high rise-up voltage Vpp (normal write voltage) to the low internal power source voltage Vaa as shown in FIG. 30. Consequently, the potential between the bit line /BL and BL on the sense amplifier side is kept changing between the ground potential Vss and the internal power source potential Vaa, and in the bit lines /BL, BL on the cell array side, as shown in FIG. 30, the "1" data write voltage is lowered to Vaa−Vt (Vt: threshold voltage of the separating MOS transistor 130). Because the "1" data write voltage is lowered to Vaa−Vt at the low voltage write time, the imprint which may be caused by heat, stress or the like to the cell array is prevented. On the other hand, the potential between the bit lines /BL and BL on the sense amplifier side is separated from the potential between the bit lines /BL and BL on the cell array side, so that it is changed between he ground potential Vss and the internal power source potential Vaa, thereby preventing a write error.

If data stored in the cell is "1" data, in the low voltage operation shown in FIG. 30, the polarization point is changed from polarization point (c) to polarization points (g), (i), and (l) successively so that it becomes data "1" having a small polarization amount. On the other hand, if the data stored in the cell is "0" data, when data "1" is written from outside, the polarization point is changed from the polarization point (e) to polarization points (d), (i), and (l) successively, so that it becomes data "1" having a small polarization amount. In this embodiment also like the above-described embodiments, the polarization amount can be reduced thereby suppressing the problem of the imprint. Further, in this embodiment, the power source on the plate side and the bit line side do not need to be separated thereby leading to simplification of the structure. Further, according to this embodiment, it is not necessary to generate the potential on the plate line "H" level and the potential on the bit line "H" level, which are needed in the above described embodiments to realize the low voltage write operation.

In the ferroelectric random access memory of the above-described embodiments, deterioration of the FeRAM cell and generation of soft error due to soldering thermal stress or the like after shipment are prevented, thereby blocking acceleration of the imprint.

What is claimed is:

1. A ferroelectric random access memory comprising:
    a cell array including a plurality of memory cells each having a ferroelectric memory device and a cell selecting transistor connected in series to said ferroelectric storage device; and
    imprint restricting circuit configured to restrict generation of an imprint by setting a polarization amount of a ferroelectric film of the ferroelectric memory device in the memory cell to an amount smaller than a polarization amount generated at a normal write time.

2. The ferroelectric random access memory according to claim 1, wherein said imprint restricting circuit is a low voltage write circuit which writes to reduce the polarization amount of said ferroelectric film by applying a low voltage lower than a voltage applied at the normal write time to said ferroelectric memory device.

3. The ferroelectric random access memory according to claim 1, wherein said imprint restricting circuit is a low voltage write circuit which writes by applying a low voltage which is higher than a resisting voltage of said ferroelectric memory device and lower than a saturation voltage saturating the polarization amount of said ferroelectric film in said ferroelectric memory device.

4. The ferroelectric random access memory according to claim 2, wherein said low voltage write circuit comprises:
    a low voltage generating circuit which generates said low voltage by dividing a write voltage at the normal write time; and
    a circuit which applies a pulse voltage having an amplitude of said low voltage to bit lines connected to said memory cells.

5. The ferroelectric random access memory according to claim 3, wherein said low voltage write circuit comprises:
    a low voltage generating circuit which generates said low voltage by dividing a write voltage at the normal write time; and
    a circuit which applies a pulse voltage having an amplitude of said low voltage to bit lines connected to said memory cells.

6. The ferroelectric random access memory according to claim 2, wherein said low voltage write circuit comprises:
    a low voltage generating circuit which generates said low voltage by dividing a write voltage at the normal write time; and
    a circuit which applies a pulse voltage having an amplitude of said low voltage to plate lines connected to said memory cells.

7. The ferroelectric random access memory according to claim 3, wherein said low voltage write circuit comprises:
    a low voltage generating circuit which generates said low voltage by dividing a write voltage at the normal write time; and
    a circuit which applies a pulse voltage having an amplitude of said low voltage to plate lines connected to said memory cells.

8. The ferroelectric random access memory according to claim 2, wherein said low voltage write circuit comprises:
    a low voltage generating circuit which generates said low voltage by dividing a write voltage at the normal write time; and
    a first circuit which applies a pulse voltage having an amplitude of said low voltage to bit lines connected to said memory cells;
    a second circuit which applies a pulse voltage having an amplitude of said low voltage to plate lines connected to said memory cells.

9. The ferroelectric random access memory according to claim 3, wherein said low voltage write circuit comprises:
    a low voltage generating circuit which generates said low voltage by dividing a write voltage at the normal write time; and
    a first circuit which applies a pulse voltage having an amplitude of said low voltage to bit lines connected to said memory cells;
    a second circuit which applies a pulse voltage having an amplitude of said low voltage to plate lines connected to said memory cells.

10. The ferroelectric random access memory according to claim 2, wherein said low voltage write circuit comprises:

a low voltage generating circuit which generates said low voltage by dividing a write voltage at the normal write time; and a circuit which with a voltage having an amplitude of said low voltage applied to bit lines connected to said memory cells, applies a pulse voltage having a predetermined amplitude to the plate lines connected to said memory cells.

11. The ferroelectric random access memory according to claim 3, wherein said low voltage write circuit comprises:

a low voltage generating circuit which generates said low voltage by dividing a write voltage at the normal write time; and a circuit which with a voltage having an amplitude of said low voltage applied to bit lines connected to said memory cells, applies a pulse voltage having a predetermined amplitude to the plate lines connected to said memory cells.

12. The ferroelectric random access memory according to claim 2, wherein said low voltage write circuit comprises:

a low voltage generating circuit which generates said low voltage by dividing a write voltage at the normal write time; and a circuit which with a voltage having an amplitude of said low voltage applied to plate lines connected to said memory cells, applies a pulse voltage having a predetermined amplitude to the bit lines connected to said memory cells.

13. The ferroelectric random access memory according to claim 3, wherein said low voltage write circuit comprises:

a low voltage generating circuit which generates said low voltage by dividing a write voltage at the normal write time; and a circuit which with a voltage having an amplitude of said low voltage applied to plate lines connected to said memory cells, applies a pulse voltage having a predetermined amplitude to the bit lines connected to said memory cells.

14. The ferroelectric random access memory according to claim 1, wherein said memory cell is connected between the bit line and the plate line.

15. The ferroelectric random access memory according to claim 1, wherein a gate of said cell selecting transistor is connected to the word line.

16. The ferroelectric random access memory according to claim 1, wherein said ferroelectric memory device comprises a ferroelectric capacitor.

17. A ferroelectric random access memory comprising:

a cell array including a plurality of memory cells each having a ferroelectric memory device and a switching transistor connected in parallel to said ferroelectric storage device; and imprint restricting circuit configured to restrict generation of an imprint by setting a polarization amount of a ferroelectric film of the ferroelectric memory device in the memory cell to an amount smaller than a polarization amount generated at a normal write time.

18. The ferroelectric random access memory according to claim 17, wherein said imprint restricting circuit is a low voltage write circuit which writes to reduce the polarization amount of said ferroelectric film by applying a low voltage lower than a voltage applied at the normal write time to said ferroelectric memory device.

19. The ferroelectric random access memory according to claim 17, wherein said imprint restricting circuit is a low voltage write circuit which writes by applying a low voltage which is higher than a resisting voltage of said ferroelectric memory device and lower than a saturation voltage saturating the polarization amount of said ferroelectric film in said ferroelectric memory device.

20. The ferroelectric random access memory according to claim 18, wherein said low voltage write circuit comprises:

a low voltage generating circuit which generates said low voltage by dividing a write voltage at the normal write time; and a circuit which applies a pulse voltage having an amplitude of said low voltage to bit lines connected to said memory cells.

21. The ferroelectric random access memory according to claim 19, wherein said low voltage write circuit comprises:

a low voltage generating circuit which generates said low voltage by dividing a write voltage at the normal write time; and a circuit which applies a pulse voltage having an amplitude of said low voltage to bit lines connected to said memory cells.

22. The ferroelectric random access memory according to claim 18, wherein said low voltage write circuit comprises:

a low voltage generating circuit which generates said low voltage by dividing a write voltage at the normal write time; and a circuit which applies a pulse voltage having an amplitude of said low voltage to plate lines connected to said memory cells.

23. The ferroelectric random access memory according to claim 19, wherein said low voltage write circuit comprises:

a low voltage generating circuit which generates said low voltage by dividing a write voltage at the normal write time; and a circuit which applies a pulse voltage having an amplitude of said low voltage to plate lines connected to said memory cells.

24. The ferroelectric random access memory according to claim 18, wherein said low voltage write circuit comprises:

a low voltage generating circuit which generates said low voltage by dividing a write voltage at the normal write time; and a first circuit which applies a pulse voltage having an amplitude of said low voltage to bit lines connected to said memory cells; a second circuit which applies a pulse voltage having an amplitude of said low voltage to plate lines connected to said memory cells.

25. The ferroelectric random access memory according to claim 19, wherein said low voltage write circuit comprises:

a low voltage generating circuit which generates said low voltage by dividing a write voltage at the normal write time; and a first circuit which applies a pulse voltage having an amplitude of said low voltage to bit lines connected to said memory cells;

a second circuit which applies a pulse voltage having an amplitude of said low voltage to plate lines connected to said memory cells.

26. The ferroelectric random access memory according to claim 18, wherein said low voltage write circuit comprises:

a low voltage generating circuit which generates said low voltage by dividing a write voltage at the normal write time; and a circuit which with a voltage having an amplitude of said low voltage applied to bit lines connected to said memory cells, applies a pulse voltage having a predetermined amplitude to the plate lines connected to said memory cells.

27. The ferroelectric random access memory according to claim 19, wherein said low voltage write circuit comprises:
   a low voltage generating circuit which generates said low voltage by dividing a write voltage at the normal write time; and
   a circuit which with a voltage having an amplitude of said low voltage applied to bit lines connected to said memory cells, applies a pulse voltage having a predetermined amplitude to the plate lines connected to said memory cells.

28. The ferroelectric random access memory according to claim 18, wherein said low voltage write circuit comprises:
   a low voltage generating circuit which generates said low voltage by dividing a write voltage at the normal write time; and
   a circuit which with a voltage having an amplitude of said low voltage applied to plate lines connected to said memory cells, applies a pulse voltage having a predetermined amplitude to the bit lines connected to said memory cells.

29. The ferroelectric random access memory according to claim 19, wherein said low voltage write circuit comprises:
   a low voltage generating circuit which generates said low voltage by dividing a write voltage at the normal write time; and
   a circuit which with a voltage having an amplitude of said low voltage applied to plate lines connected to said memory cells, applies a pulse voltage having a predetermined amplitude to the bit lines connected to said memory cells.

30. The ferroelectric random access memory according to claim 17, wherein said memory cell is connected between the bit line and the plate line through a cell selecting transistor.

31. The ferroelectric random access memory according to claim 30, wherein a gate of the switching transistor is connected to the word line.

32. The ferroelectric random access memory according to claim 17, wherein cell blocks each includes said memory cells connected in series and a cell block selecting transistor which selects said each cell block, wherein said memory cells connected in series are connected between said plate line and said bit line through said cell block selecting transistor.

33. The ferroelectric random access memory according to claim 32, wherein a gate of said cell block selecting transistor is connected to a cell block selecting line.

34. The ferroelectric random access memory according to claim 17, wherein said ferroelectric memory device comprises a ferroelectric capacitor.

35. A ferroelectric random access memory comprising:
   a sense amplifier configured to be connected to a bit line and to amplify data read out to said bit line;
   a cell block comprising a plurality of memory cells; and
   a separating transistor inserted in said bit line between said sense amplifier and said cell block, wherein
      said separating transistor is controlled by a gate control signal at a write time to lower a bit line potential on the cell block side than a bit line potential on the sense amplifier side.

36. The ferroelectric random access memory according to claim 35, wherein said cell block comprises a plurality of unit cells each including a ferroelectric memory device and a cell selecting transistor connected in series to said ferroelectric memory device.

37. The ferroelectric random access memory according to claim 36, wherein a gate of said cell selecting transistor is connected to the word line.

38. The ferroelectric random access memory according to claim 36, wherein said each unit cell is connected between the bit line and the plate line.

39. The ferroelectric random access memory according to claim 35, wherein said each cell block comprises a plurality of unit cells each including a ferroelectric memory device, a switching transistor connected in parallel to said ferroelectric memory device, and a cell selecting transistor connected in series to said ferroelectric memory device and said switching transistor.

40. The ferroelectric random access memory according to claim 39, wherein a gate of the switching transistor is connected to the word line.

41. The ferroelectric random access memory according to claim 39, wherein a gate of said cell selecting transistor is connected to a cell selecting line.

42. The ferroelectric random access memory according to claim 39, wherein the plurality of the unit cells connected in series are connected between the plate line and said bit line through a cell block selecting transistor.

43. The ferroelectric random access memory according to claim 42, wherein a gate of said cell block selecting transistor is connected to a cell block selecting line.

* * * * *

UNITED STATES PATENT AND TRADEMARK OFFICE
CERTIFICATE OF CORRECTION

PATENT NO.    : 6,611,450 B2                                                      Page 1 of 1
DATED         : August 26, 2003
INVENTOR(S)   : Yukihito Oowaki et al.

It is certified that error appears in the above-identified patent and that said Letters Patent is hereby corrected as shown below:

Column 23,
Line 52, "parallet" has been replaced with -- parallel --.

Signed and Sealed this

Thirtieth Day of December, 2003

JAMES E. ROGAN
*Director of the United States Patent and Trademark Office*